(12) United States Patent
Schwarz

(10) Patent No.: US 12,278,319 B2
(45) Date of Patent: Apr. 15, 2025

(54) COMPONENT FOR A DISPLAY, AND METHOD FOR PRODUCING A COMPONENT

(71) Applicant: OSRAM Opto Semiconductors GmbH, Regensburg (DE)

(72) Inventor: Thomas Schwarz, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 500 days.

(21) Appl. No.: 17/636,204

(22) PCT Filed: Nov. 27, 2020

(86) PCT No.: PCT/EP2020/083771
§ 371 (c)(1),
(2) Date: Feb. 17, 2022

(87) PCT Pub. No.: WO2021/105453
PCT Pub. Date: Jun. 3, 2021

(65) Prior Publication Data
US 2022/0293836 A1    Sep. 15, 2022

(30) Foreign Application Priority Data
Nov. 28, 2019    (DE) .................... 10 2019 218 501.0

(51) Int. Cl.
*H01L 27/15*    (2006.01)
*H01L 25/075*    (2006.01)
(Continued)

(52) U.S. Cl.
CPC .......... *H01L 33/62* (2013.01); *H01L 25/0753* (2013.01); *H01L 33/54* (2013.01); *H01L 2933/005* (2013.01); *H01L 2933/0066* (2013.01)

(58) Field of Classification Search
CPC ..... H01L 33/62; H01L 25/0753; H01L 33/54; H01L 2933/005; H01L 2933/0066;
(Continued)

(56) References Cited

U.S. PATENT DOCUMENTS 10,453,827 B1    10/2019 Hussell et al.
2012/0037929 A1*    2/2012 Ramchen ............... H01L 24/34
                                                257/E33.059
(Continued)

FOREIGN PATENT DOCUMENTS

CN    106992169 A    7/2017
DE    112011103147 T5    7/2013
(Continued)

OTHER PUBLICATIONS

International Search Report and Written Opinion issued in International Patent Application No. PCT/EP2020/083771 on Mar. 1, 2021.
(Continued)

*Primary Examiner* — Theresa T Doan
(74) *Attorney, Agent, or Firm* — ArentFox Schiff LLP

(57) ABSTRACT

The invention relates to a component with a support and a plurality of semiconductor chips, in which the support has a single-ply, electrically conducting support layer, wherein the support layer is structured and has a plurality of sublayers. The support layer has a mounting surface, on which the semiconductor chips are arranged, wherein the semiconductor chips are mechanically supported by the support layer and electrically conductively connected to the sublayers. The support has a common electrode for semiconductor chips of a group of a plurality of semiconductor chips,
(Continued)

Figure 1A:
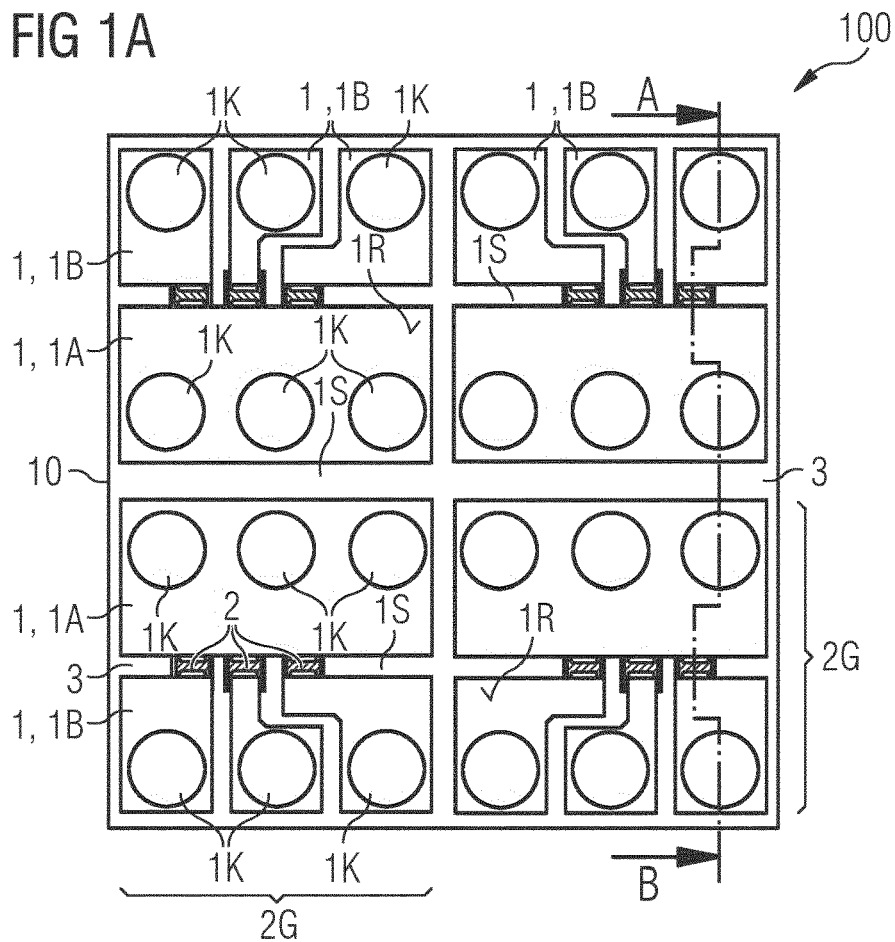

wherein the common electrode is formed by one of the sublayers or by a plurality of electrically connected sublayers of the support layer. The invention further relates to a method for producing a component of this kind.

11 Claims, 11 Drawing Sheets

(51) Int. Cl.
    *H01L 31/12*     (2006.01)
    *H01L 33/54*     (2010.01)
    *H01L 33/62*     (2010.01)

(58) Field of Classification Search
    CPC . H01L 2224/16245; H01L 2224/32245; H01L 2224/73204; H01L 2933/0033; H01L 33/486; H01L 2933/0025; H01L 2933/0058; H01L 33/44
    USPC .......................................................... 257/79
    See application file for complete search history.

(56) References Cited

U.S. PATENT DOCUMENTS

| | | | |
|---|---|---|---|
| 2014/0117388 A1* | 5/2014 | Kuo | ................ H01L 33/54 |
| | | | 257/E33.059 |
| 2015/0001563 A1 | 1/2015 | Miki | |
| 2019/0280163 A1 | 9/2019 | Li et al. | |

FOREIGN PATENT DOCUMENTS

| | | |
|---|---|---|
| DE | 102014102810 A1 | 9/2015 |
| DE | 102015214222 A1 | 2/2017 |
| DE | 102016101526 A1 | 8/2017 |
| DE | 102017128457 A1 | 6/2019 |
| DE | 102018111175 A1 | 11/2019 |
| EP | 2963685 A1 | 1/2016 |

OTHER PUBLICATIONS

Office Action received for DE Patent Application No. 102019218501.0, mailed on Mar. 22, 2024, 5 pages (Official Copy only).

* cited by examiner

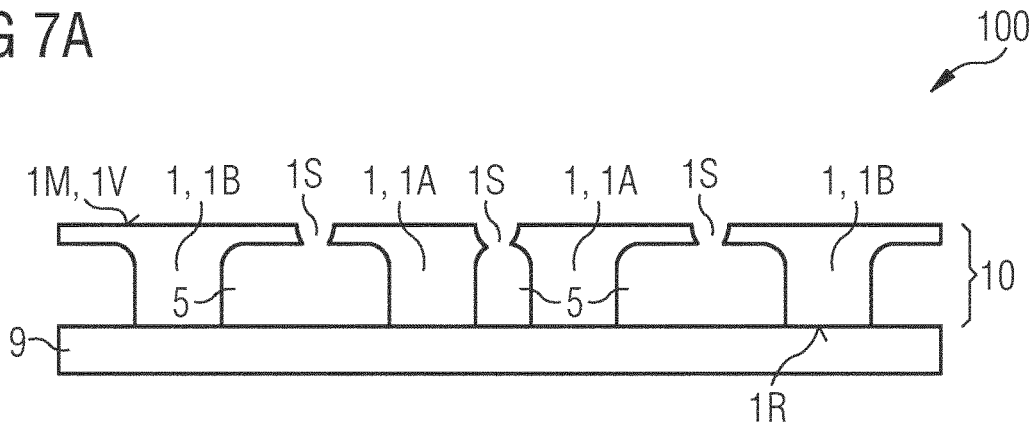
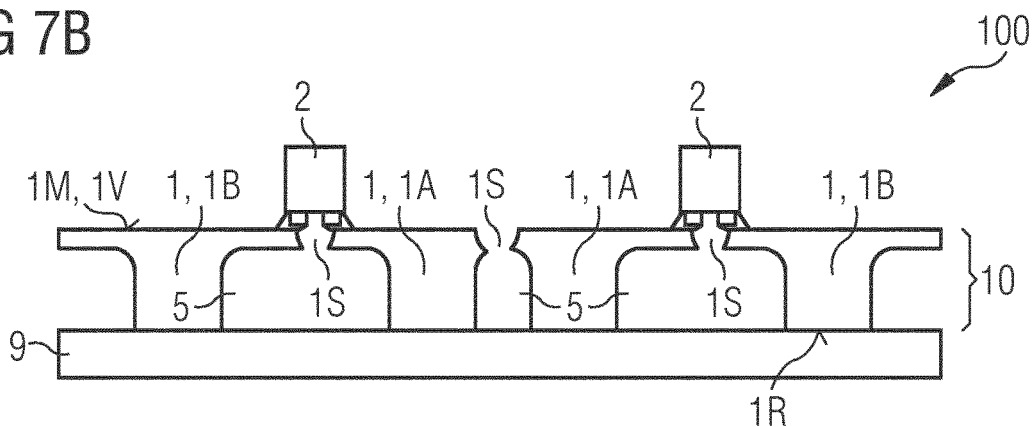
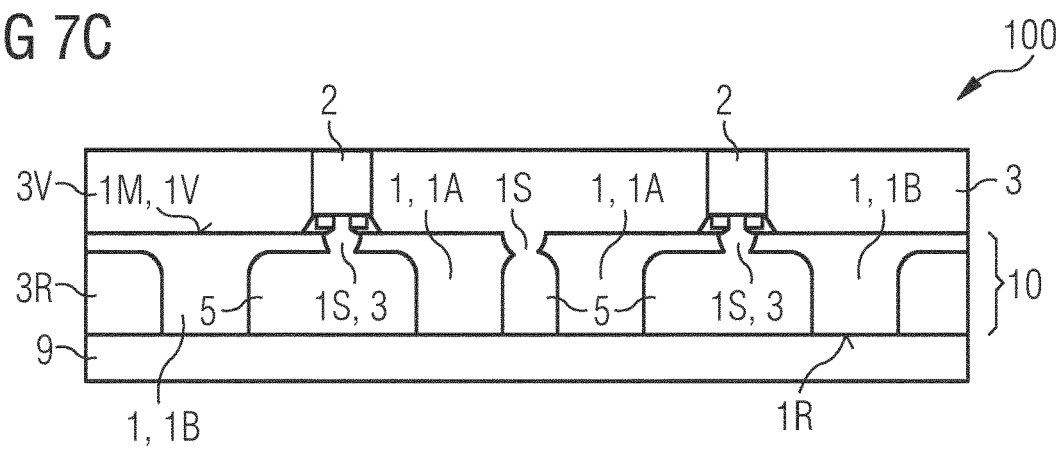
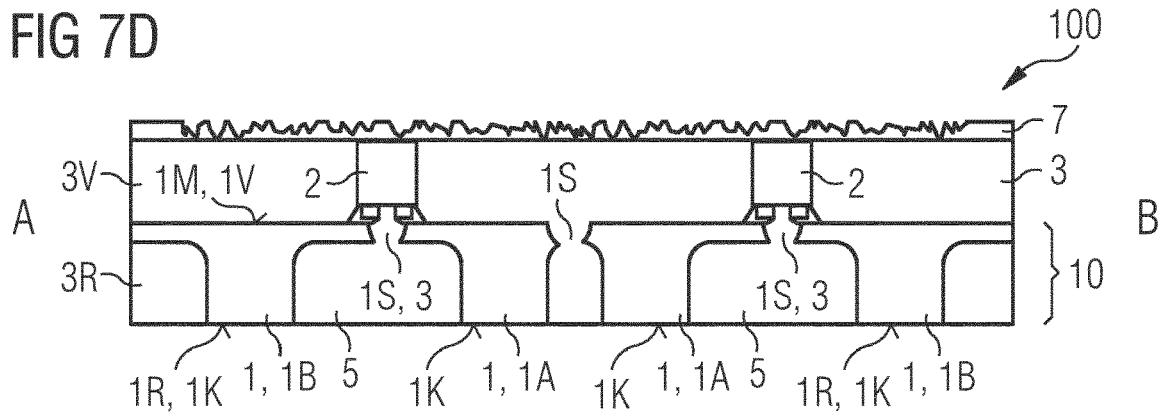

COMPONENT FOR A DISPLAY, AND METHOD FOR PRODUCING A COMPONENT

A component in particular for a display or for a display device is specified. Furthermore, a method for producing a component, in particular a component described here, is specified.

This patent application is a 35 U.S.C. § 371 National Phase of PCT Application No. PCT/EP2020/083771, filed on Nov. 27, 2020, which claims the priority of German patent application 10 2019 218 501.0, filed Nov. 28, 2019, the disclosures of each content of which are hereby incorporated by reference.

Components, in particular LED chips, for display devices are being made ever smaller for cost reasons. The requirements made for example of the printed circuit boards on which the LED chips are mounted and electrically contacted are increasing as a result. For example, a two-layer or multilayer construction of the printed circuit board is a cost driver since such a construction is often able to be realized only through the use of cost-intensive, additively manufactured conductor tracks, and is generally associated with a long process chain comprising laminating, drilling, double-sided phototechnology, structuring, electroplating and etching processes.

One object is to specify a component in particular for a display device which is configured compactly and can easily be mounted and contacted. A further object is to specify a reliable and cost-effective method for producing a component.

These objects are achieved by means of a component as claimed in the main claim and by means of a method for producing a component, in particular a component described here. The further claims relate to further configurations of the component or of the method for producing the component.

In accordance with at least one embodiment of the component, the latter has a carrier and a plurality of semiconductor chips arranged thereon. The semiconductor chips are in particular optoelectronic semiconductor chips configured for example for generating electromagnetic radiation for instance in the infrared, visible or ultraviolet spectral range. The semiconductor chips can be flip-chips or micro-LEDs. Moreover, it is possible for the semiconductor chips to be carrierless or packageless LED chips.

A plurality of semiconductor chips, for example exactly three or exactly four semiconductor chips, can form a group for representing a pixel. The semiconductor chips of the same group are configured in particular for generating light of different colors. For example, the group for representing a pixel has exactly three optoelectronic semiconductor chips, wherein the group comprises one semiconductor chip which emits red light, one semiconductor chip which emits green light and one semiconductor chip which emits blue light. Such a group forms an RBG pixel. Moreover, it is possible for the group for representing a pixel to have exactly four optoelectronic semiconductor chips.

In accordance with at least one embodiment of the component, the carrier has a carrier layer. The carrier layer is embodied in particular in electrically conductive fashion. For example, the carrier layer is formed from a metal, in particular from copper or nickel or from copper-nickel alloy. The semiconductor chips can be mounted indirectly or directly on the carrier layer. In particular, the semiconductor chips are mechanically supported by the carrier layer. The carrier layer can have a plurality of partial layers, wherein the semiconductor chips arranged on the carrier layer can be electrically conductively connected to the partial layers of the carrier layer.

The carrier layer has a vertical layer thickness that is preferably between 20 µm and 200 µm inclusive, for example between 20 µm and 150 µm inclusive, between 20 µm and 100 µm inclusive, between 30 µm and 100 µm inclusive, between 40 µm and 100 µm inclusive, or between 50 µm and 100 µm inclusive. Moreover, it is possible for the vertical layer thickness of the carrier layer to be somewhat less than 20 µm, less than 10 µm, or greater than 200 µm. For example, the vertical layer thickness of the carrier layer is between 5 µm and 500 µm inclusive, for example between 10 µm and 400 µm inclusive, between 10 µm and 300 µm inclusive, or between 10 µm and 250 µm inclusive.

A vertical direction is understood to mean a direction that is directed in particular perpendicular to a main surface of extent of the carrier or the carrier layer. A lateral direction is understood to mean a direction that runs in particular parallel to the main surface of extent. The vertical direction and the lateral direction are orthogonal to one another.

In at least one embodiment of a component, the latter has a carrier and a plurality of semiconductor chips. The carrier has an electrically conductive carrier layer, wherein the carrier layer is embodied in structured fashion and has a plurality of partial layers. The carrier layer has a mounting surface, on which the semiconductor chips are arranged, wherein the semiconductor chips are mechanically supported by the carrier layer and are electrically conductively connected to the partial layers. The carrier has a common electrode for semiconductor chips of a group composed of a plurality of the semiconductor chips, wherein the common electrode is formed by one of the partial layers or by a plurality of partial layers—which are in electrical contact with one another—of the carrier layer. It is possible for all the semiconductor chips of the same group to share a common electrode.

The carrier layer serves in particular as a leadframe of the component. In particular, the carrier layer is of single-layer design. The component can thus be made particularly thin. Since the semiconductor chips have in part common electrodes, the component can be mounted and contacted on a printed circuit board in a simple manner in the form of a cross-matrix circuit, for instance. In this case, the printed circuit board can be of single-layer and not necessarily at least two-layer or multilayer design. The internal connection of anodes or cathodes of different semiconductor chips can make it possible to dispense with at least one metal plane of the printed circuit board. The lateral distances between the partial layers of the carrier layer can likewise be kept small, for example less than or equal to 50 µm, 40 µm, 30 µm or less than 20 µm, for instance between 5 µm and 50 µm inclusive.

In accordance with at least one embodiment of the component, the vertical layer thickness of the carrier layer is between 20 µm and 200 µm inclusive. Such a carrier layer is sufficiently stable for the production of a thin carrier or a thin component. Moreover, such a thin carrier layer can be processed particularly well.

In accordance with at least one embodiment of the component, the semiconductor chips are configured for generating electromagnetic radiation. In particular, the group composed of those semiconductor chips which share the common electrode forms one pixel or a plurality of pixels, in particular two or a plurality of adjacent pixels. The pixels are configured in particular for representing an arbitrary color of a color spectrum of visible light. The pixels can also be referred to as picture elements. For example, each pixel has at least three semiconductor chips, in particular exactly three or exactly four semiconductor chips, configured for example for generating electromagnetic radiation of different peak wavelengths. The semiconductor chips can have exclusively rear-side contacts. For example, the semiconductor chips are embodied as flip-chips, for instance as sapphire flip-chips. Moreover, it is possible for the semiconductor chips each to have exclusively front-side contacts or to have a front-side contact and a rear-side contact.

In accordance with at least one embodiment of the component, those semiconductor chips which share the common electrode and form one pixel are in each case electrically conductively connected to a further individual partial layer. In this regard, these semiconductor chips can in each case be individually drivable via the partial layers.

In accordance with at least one embodiment of the component, the group composed of the semiconductor chips has at least three semiconductor chips, each of which bridges an intermediate region between two adjacent partial layers of the carrier layer. For example, one of the two adjacent partial layers forms the common electrode for the semiconductor chips of the same group, in particular for all semiconductor chips of the same group.

In accordance with at least one embodiment of the component, two adjacent partial layers of the carrier layer are spaced apart laterally from one another by an intermediate region. In particular, the two adjacent partial layers are assigned to different electrical polarities of the component. The intermediate region has a lateral width that is in particular at most 50 µm. Preferably, the lateral width is between 5 µm and 50 µm inclusive or between 10 µm and 50 µm inclusive. For example, one of the semiconductor chips is electrically conductively connected to the two adjacent partial layers. In plan view said semiconductor chip can partly cover the two adjacent partial layers and bridge the associated intermediate region situated between the two adjacent partial layers.

In accordance with at least one embodiment of the component, the intermediate region is filled with an insulation layer, which electrically insulates two adjacent partial layers of the carrier layer from one another. The insulation layer can partly or completely fill the intermediate region and can additionally serve as a solder resist layer.

In accordance with at least one embodiment of the component, the mounting surface has a plurality of laterally spaced apart partial mounting surfaces formed by surfaces of the partial layers. For example, the partial mounting surfaces are situated substantially at the same vertical height and thus form an imaginary planar surface comprising the mounting surface. The mounting surface thus delimits the carrier layer in a vertical direction and describes in particular the highest vertical elevation of the carrier layer. The carrier layer for example does not have a cavity whose bottom surface forms the mounting surface on which one or a plurality of semiconductor chips are arranged. In lateral directions the semiconductor chips are in particular not surrounded by the carrier layer.

In accordance with at least one embodiment of the component, the mounting surface is coated with a noble metal. The carrier layer has a rear side facing away from the mounting surface, which rear side can be at least partly coated with the same noble metal. The coating on the mounting surface, i.e. on the front side, or on the rear side can serve as an etching mask during the production of the component. The noble metal can be gold, NiAu or platinum. Moreover, it is possible for the coating to be formed from a different metal having in particular a lower etching rate than the material of the carrier layer.

In accordance with at least one embodiment of the component, the mounting surface is embodied in planar fashion. The semiconductor chips can project beyond the entire carrier layer along the vertical direction. In particular, the carrier layer has no partial region that projects beyond the planar mounting surface in the direction of the semiconductor chips.

In accordance with at least one embodiment of the component, the carrier has an encapsulation layer laterally enclosing the semiconductor chips. The encapsulation layer is embodied in particular in continuous fashion and can thus hold together the laterally spaced apart partial layers of the carrier layer. It is possible for the encapsulation layer to be embodied in integral fashion and in particular to laterally enclose all the semiconductor chips. It is additionally possible for the partial layers of the carrier layer only to be mechanically connected to one another by the encapsulation layer.

In accordance with at least one embodiment, the encapsulation layer and the semiconductor chips, along the vertical direction perpendicular to a main surface of extent of the carrier or the carrier layer, terminate flush with one another.

In accordance with at least one embodiment of the component, the carrier layer is completely covered by the semiconductor chips and the encapsulation layer in a plan view of the mounting surface. The carrier layer has in particular no regions that project laterally from the encapsulation layer. In particular, the component is embodied as a QFN component (Quad Flat No-Lead). For example, the component has no electrical connections or no pins that project laterally beyond the encapsulation layer. However, this does not preclude the partial layers of the carrier layer terminating regionally flush with side surfaces of the encapsulation layer. The carrier layer, embodied in particular as a leadframe, therefore does not project laterally from the encapsulation layer. This increases the compactness of the component and additionally the packing density of the components for instance on a common printed circuit board of a display device, for instance a video wall, since the components can be electrically contacted externally via their rear sides and/or via their side surfaces.

In accordance with at least one embodiment of the component, the partial layers have rear side surfaces facing away from the mounting surface. In particular, the rear side surfaces are embodied in curved fashion regionally. In particular, cavity-like openings of the carrier layer are formed by the curved rear side surfaces of adjacent partial layers. The openings can be filled with the encapsulation layer or with a further encapsulation layer in order to increase the mechanical stability of the carrier. In particular, the cavity-like openings are parts of a network system composed of trenches that laterally enclose, in particular completely enclose, the individual partial layers of the carrier layer.

In accordance with at least one embodiment of the component, the partial layers have planar rear side surfaces facing away from the mounting surface. The rear side surfaces are in particular free of a covering by the encapsulation layer. The carrier can have at least one solder ball or a contact structure on the respective rear side surfaces of the partial layers of the carrier layer. In a departure therefrom, it is possible for the rear side surfaces likewise to be covered with a material of the encapsulation layer.

In accordance with at least one embodiment of the component, the partial layers have rear side surfaces facing away from the mounting surface, wherein the semiconductor chips are laterally enclosed by a front-side partial layer of the encapsulation layer. Contact structures laterally enclosed by a rear-side partial layer of the encapsulation layer are formed on the in particular planar rear side surfaces. In particular, the front-side partial layer and the rear-side partial layer of the encapsulation layer differ from one another in their material composition.

In at least one embodiment of a display device, the latter has at least one component described here or a plurality of components described here. For example, the display device has a printed circuit board, on which the component or the plurality of components is/are arranged. In particular, the printed circuit board has a single contacting plane with conductor tracks. The display device can be a display of a technical apparatus or a video wall.

In at least one embodiment of a method for producing a component having a carrier and a plurality of semiconductor chips, a single-layer, electrically conductive and structured carrier layer composed of a plurality of partial layers is provided. The semiconductor chips are secured on a mounting surface of the structured carrier layer, wherein the semiconductor chips are mechanically supported by the carrier layer and are electrically conductively connected to the partial layers of the carrier layer. A group composed of a plurality of the semiconductor chips has a common electrode for semiconductor chips of this group, wherein the common electrode is formed by one of the partial layers or by a plurality of partial layers—which are in electrical contact with one another—of the carrier layer. It is possible for at least two semiconductor chips or all semiconductor chips of the group to share the common electrode. The carrier is completed, wherein the carrier layer is embodied as part of the carrier. Before and/or after the completion of the carrier, a vertical layer thickness can be between 10 µm and 200 µm inclusive, for example between 20 µm and 200 µm inclusive, between 20 µm and 150 µm inclusive, between 20 µm and 100 µm inclusive, between 30 µm and 100 µm inclusive, between 40 µm and 100 µm inclusive, or between 50 µm and 100 µm inclusive. Moreover, it is possible for the vertical layer thickness of the carrier layer to be somewhat less than 20 µm, less than 10 µm, or greater than 200 µm. Before, during and/or after the completion of the carrier, the carrier layer can have the same layer thickness.

In accordance with at least one embodiment of the method, providing the carrier layer comprises structuring the initially continuous carrier layer into the plurality of partial layers. Structuring the carrier layer is effected in particular in two separate etching steps, wherein the semiconductor chips are secured on the mounting surface after a first etching step and before a second etching step. During the first etching step, a first trench structure can be formed on a front side of the carrier layer, which first trench structure only extends into the carrier layer, such that the carrier layer still remains continuous. During the second etching step, a second trench structure can be formed on a rear side of the carrier layer, which second trench structure extends as far as the first trench structure, as a result of which the carrier layer is separated into the plurality of partial layers.

In accordance with at least one embodiment of the method, the first trench structure is filled with an insulation layer before the second etching step. During the second etching step, the insulation layer can be exposed on the rear side and serve in particular as an etch stop layer.

In accordance with at least one embodiment of the method, providing the carrier layer comprises structuring the initially continuous carrier layer into the plurality of partial layers. Structuring the carrier layer can be effected in two separate etching steps, wherein the semiconductor chips are secured on the mounting surface only after the process of structuring the carrier layer into the plurality of partial layers. During the first etching step, a first trench structure is formed on a front side of the carrier layer, which first trench structure in particular only extends into the carrier layer. During the second etching step, a second trench structure is formed on a rear side of the carrier layer, which second trench structure extends in particular as far as the first trench structure, as a result of which the carrier layer is separated into the plurality of partial layers.

In accordance with at least one embodiment of the method, the structured carrier layer composed of the laterally spaced apart partial layers is provided on an auxiliary carrier. In particular, the auxiliary carrier is an adhesive film. Moreover, it is possible for the auxiliary carrier to be a flexible substrate. The auxiliary carrier can be detached after the process of securing the semiconductor chips in order to expose the partial layers. A plurality of contact structures are applied to the partial layers of the carrier layer, wherein the contact structures can be solder balls, electrical contact columns or contact pins.

In accordance with at least one embodiment of the method, an encapsulation layer is formed around the semiconductor chips. The encapsulation layer can be embodied in continuous fashion. In particular, the encapsulation layer encloses the semiconductor chips and the partial layers in lateral directions and can thus hold together the laterally spaced apart partial layers. The encapsulation layer can have a front-side partial layer above the mounting surface and a rear-side partial layer below the mounting surface. The front-side partial layer and the rear-side partial layer can be formed from the same material or from different materials.

The methods described above are particularly suitable for producing a component described here. The features described in association with the component can therefore be used for the methods, and vice versa.

Figure 1B:
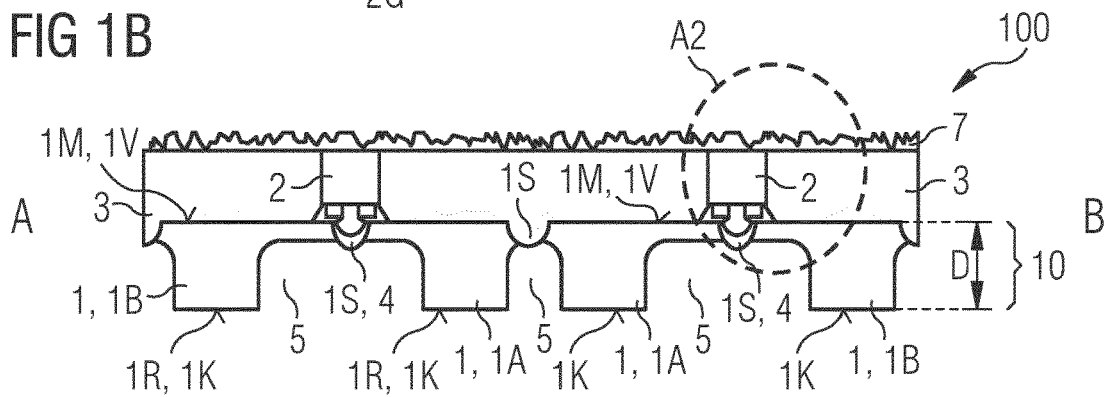
Figure 1C:
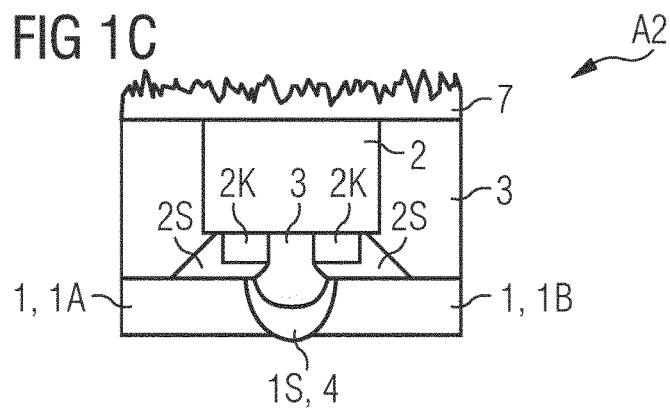
Figure 1D:
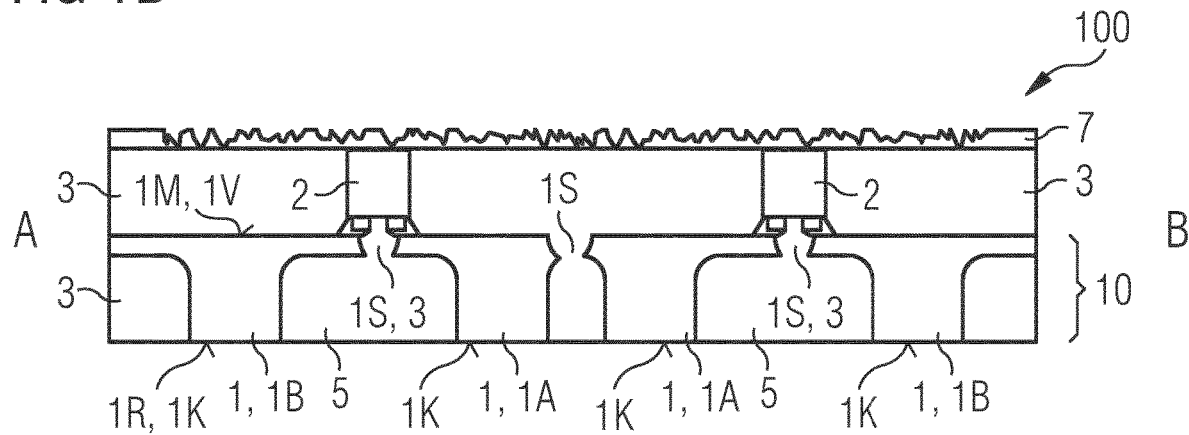
Figure 1E:
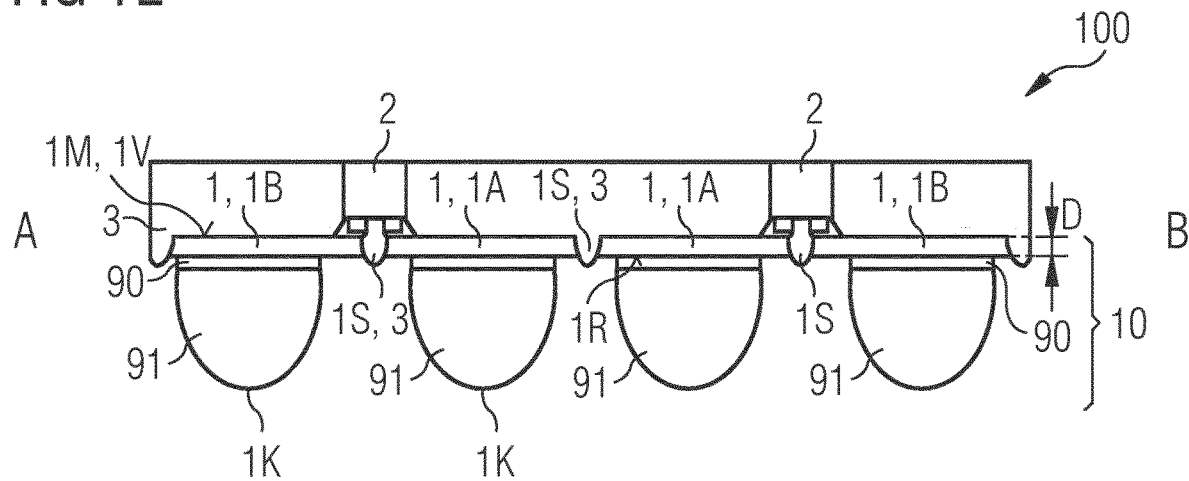
Figure 1F:
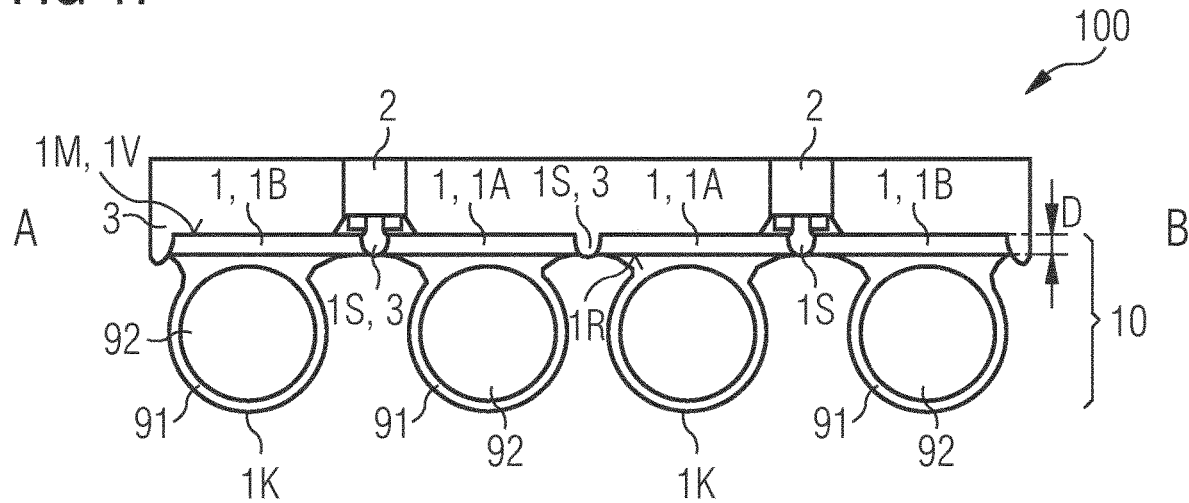
Figure 1G:
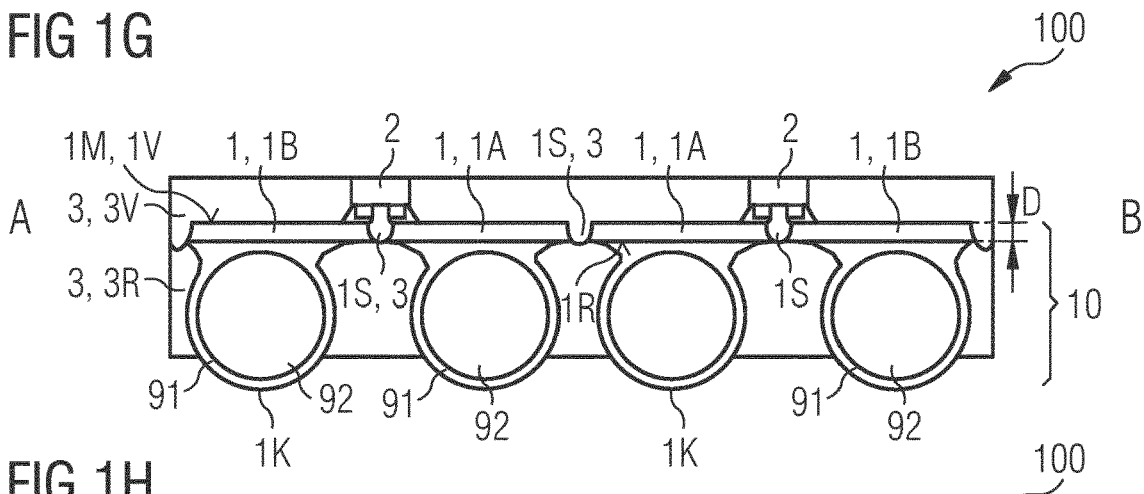
Figure 1H:
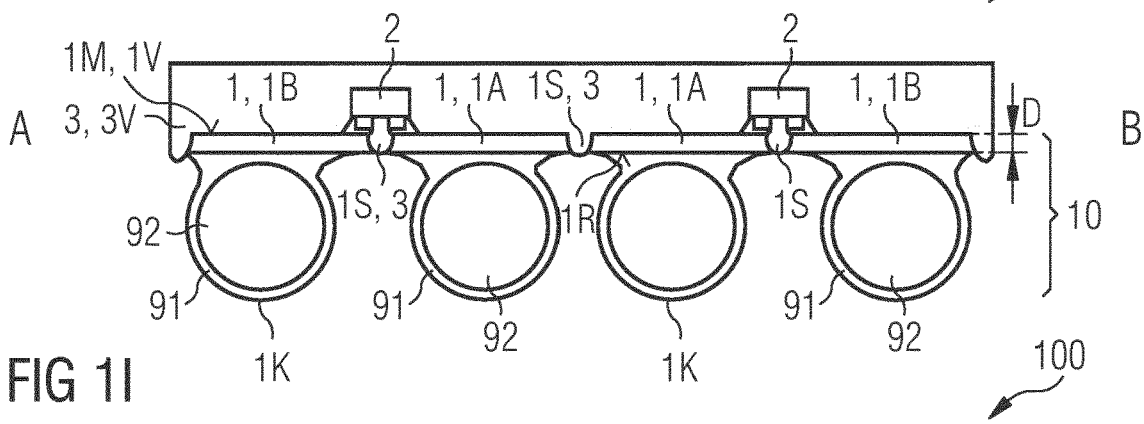
Figure 1I:
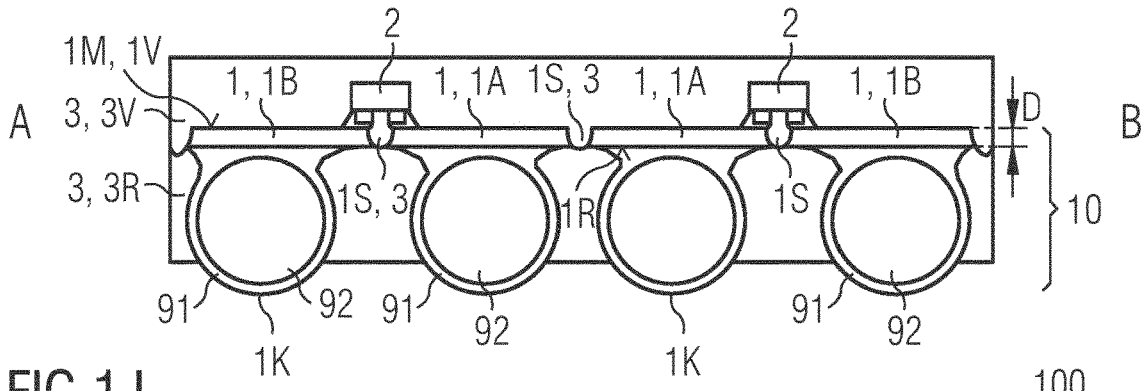
Figure 1J:
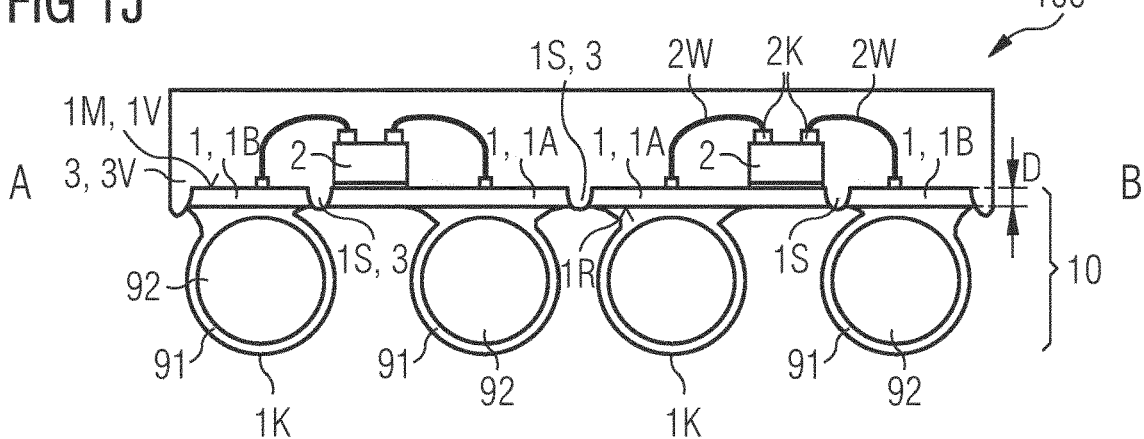
Figure 2A:
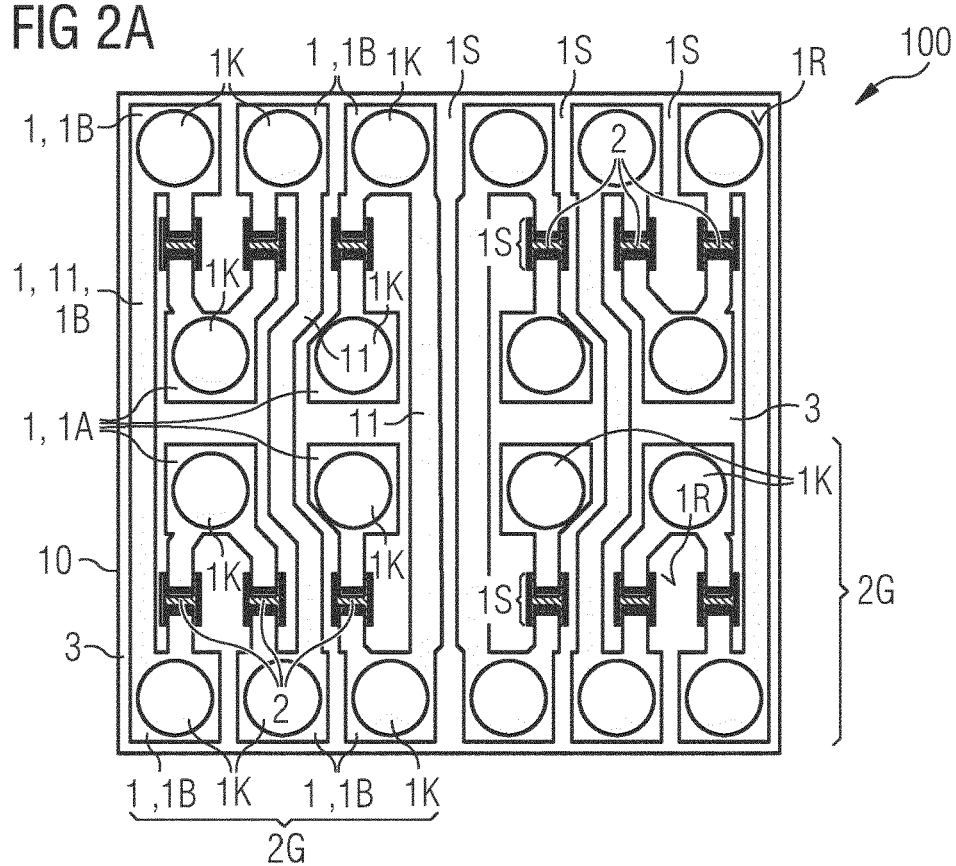
Figure 2B:
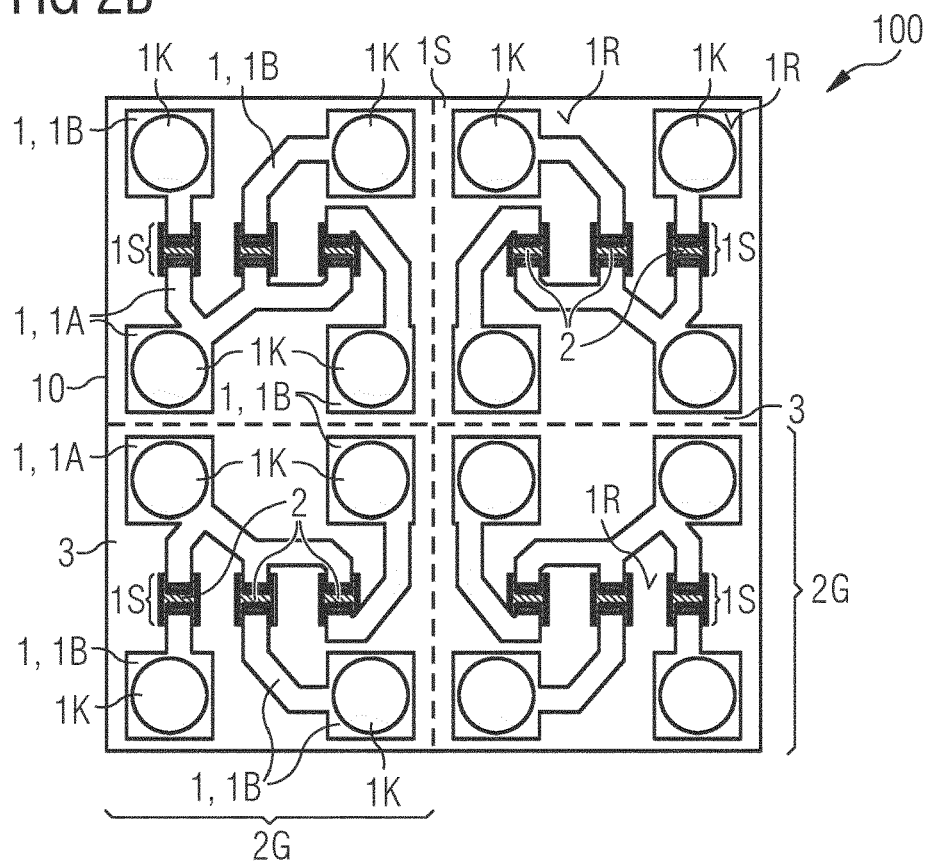
Figure 3A:
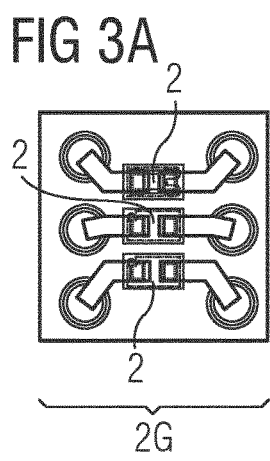
Figure 3B:
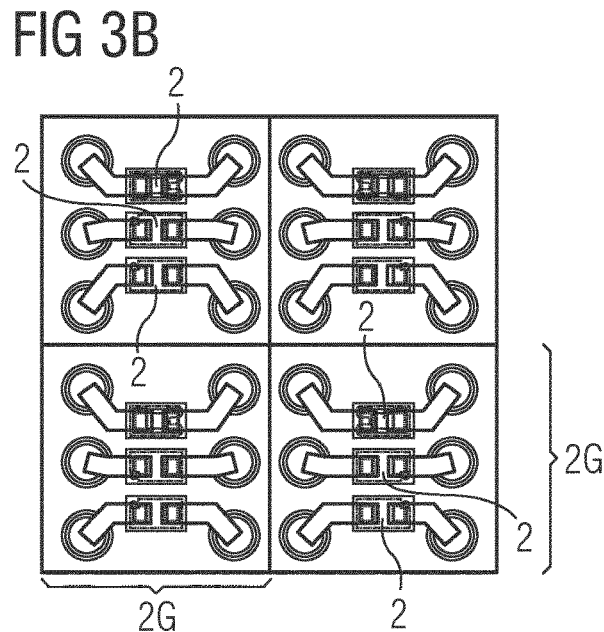
Figure 3C:
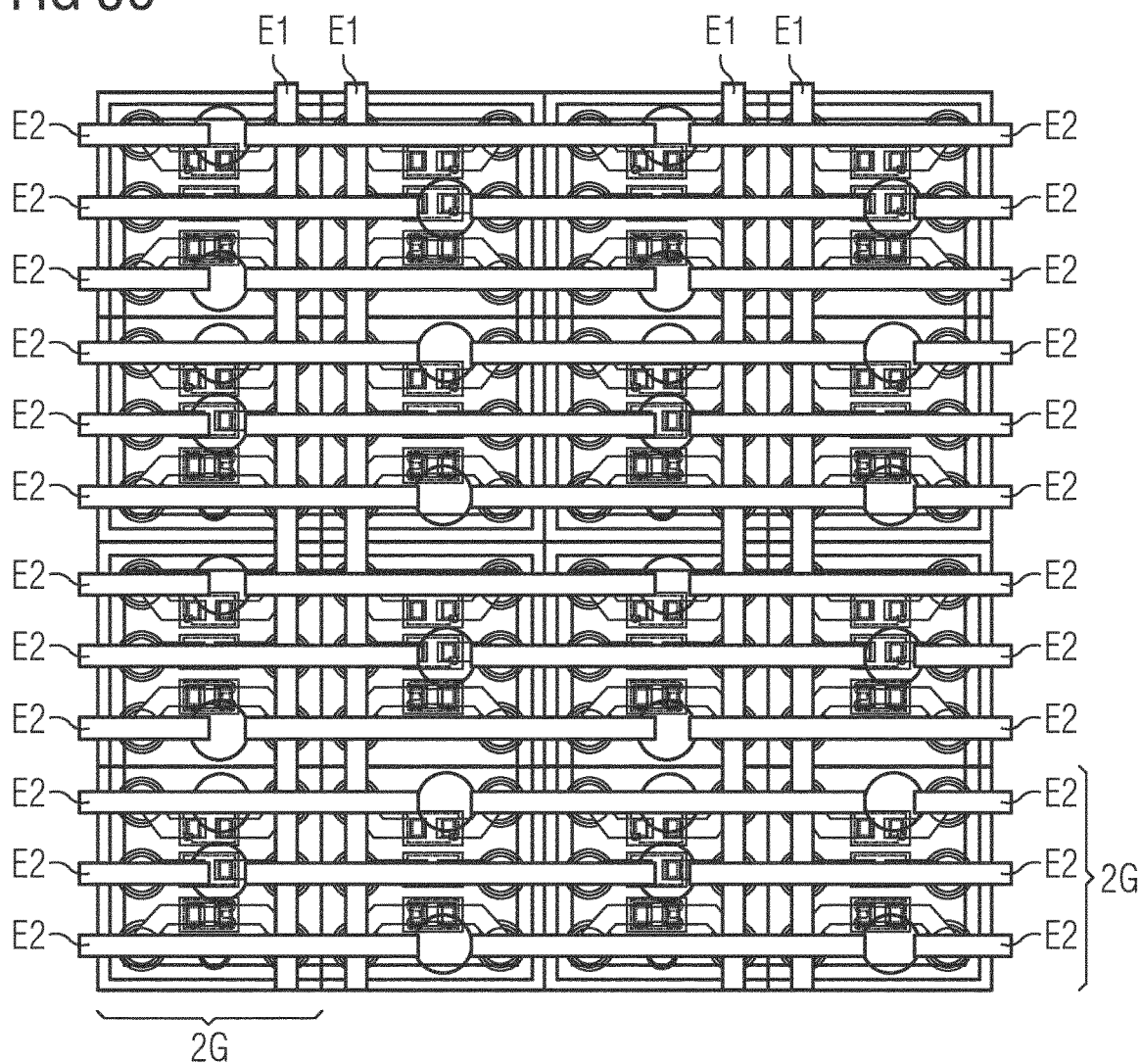
Figure 4:
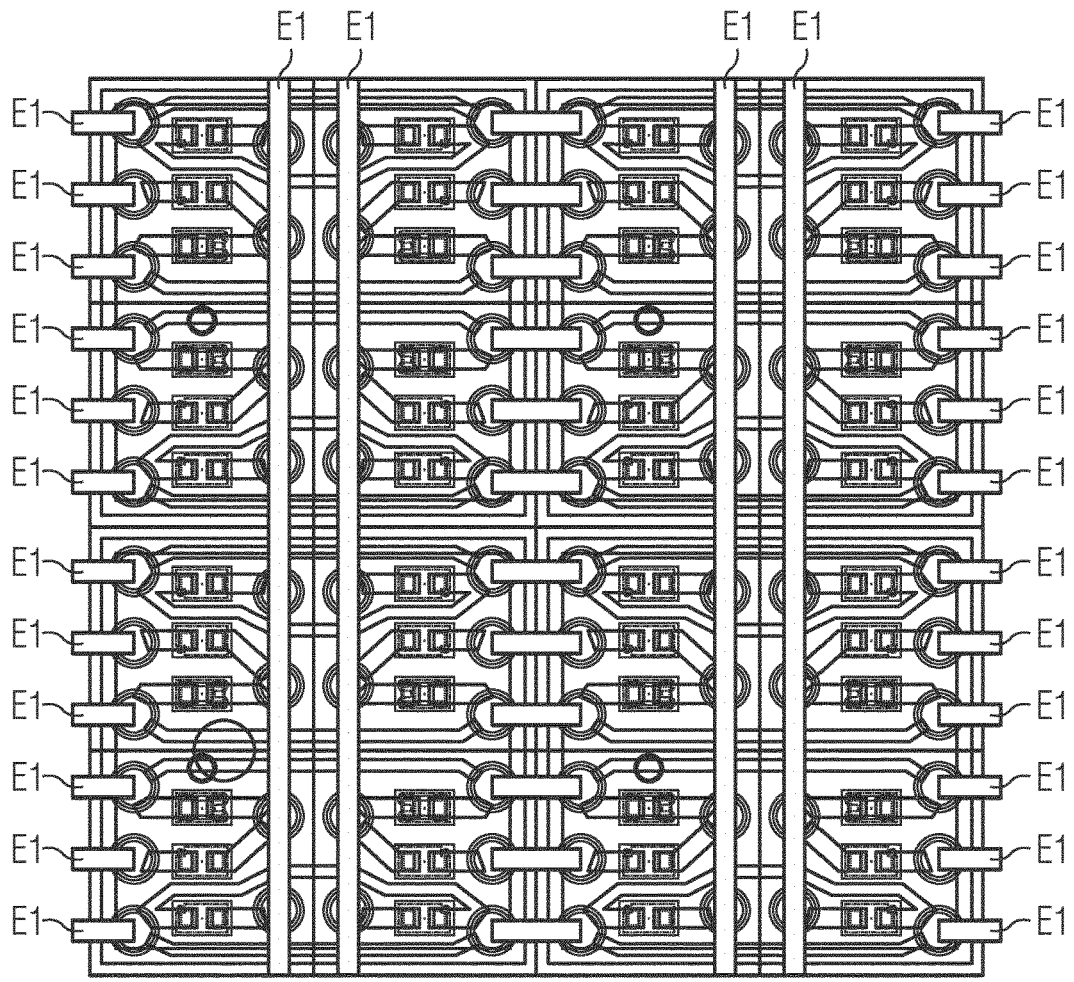
Figure 5A:
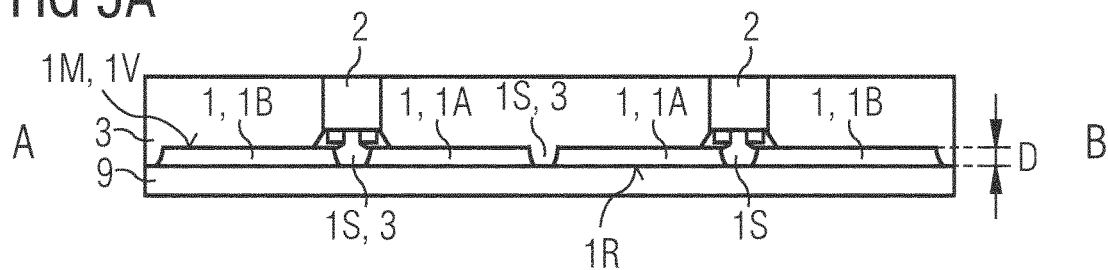
Figure 5B:
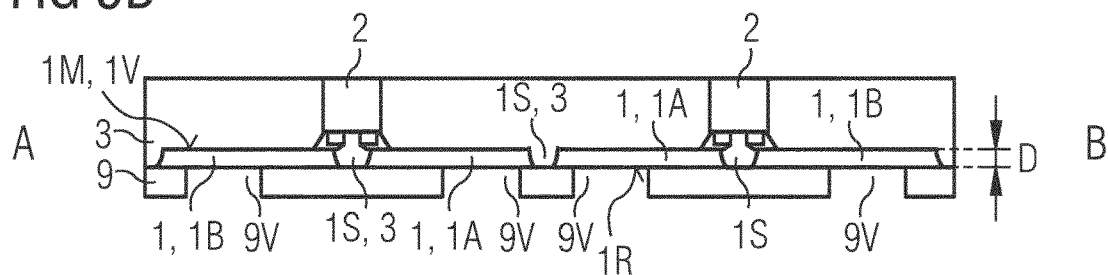
Figure 8A:
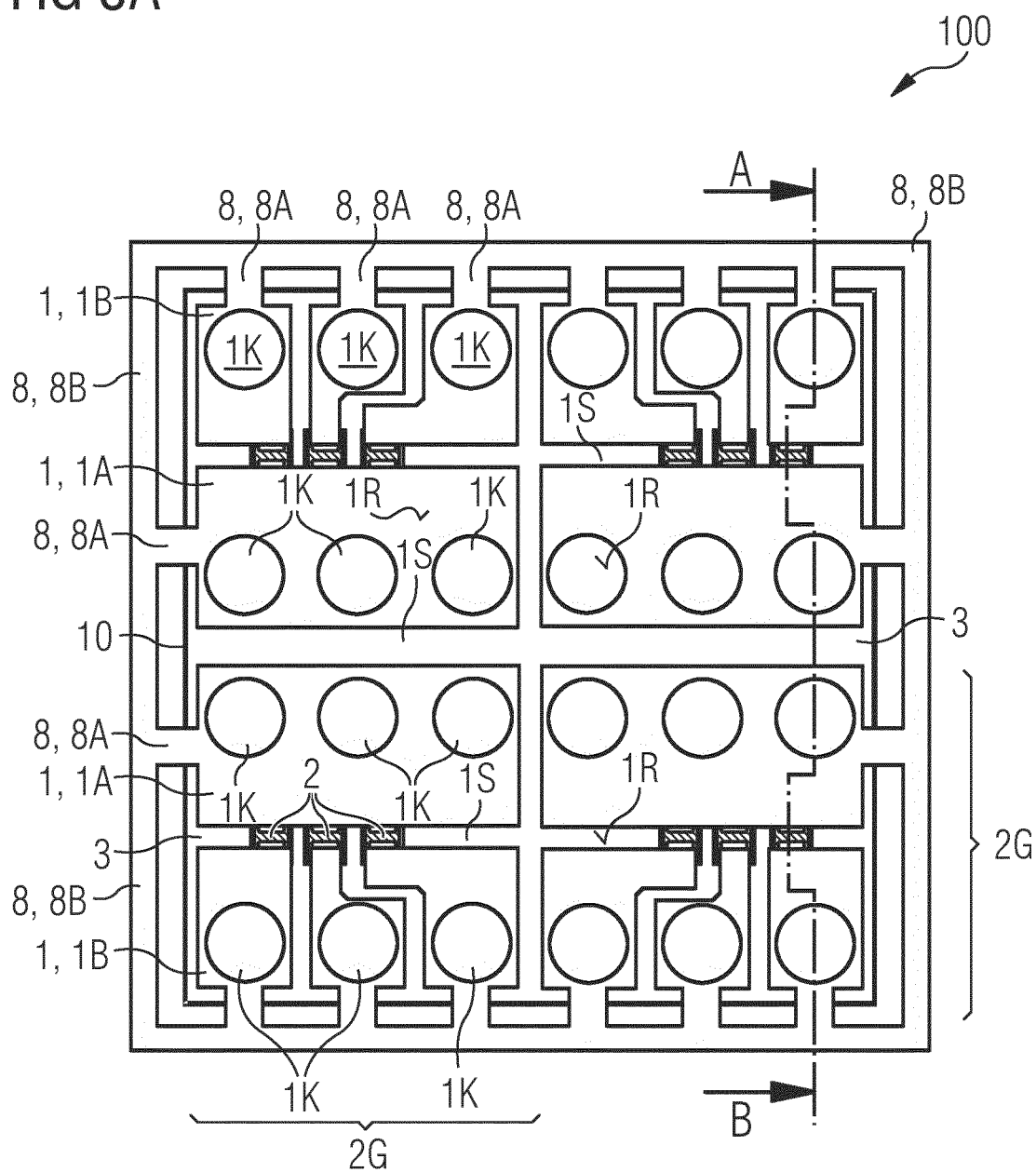
Figure 8B:
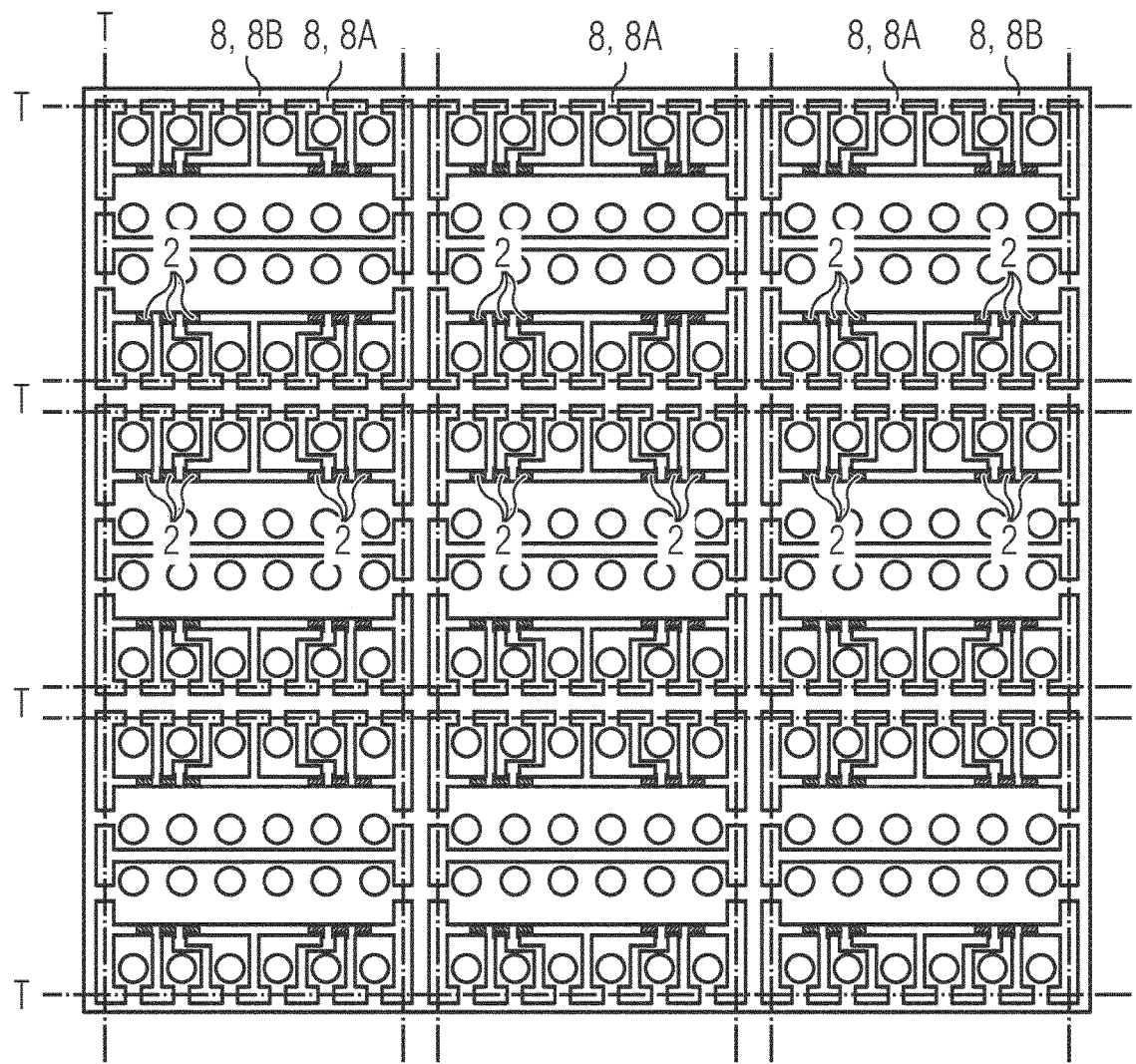
Figure 8C:
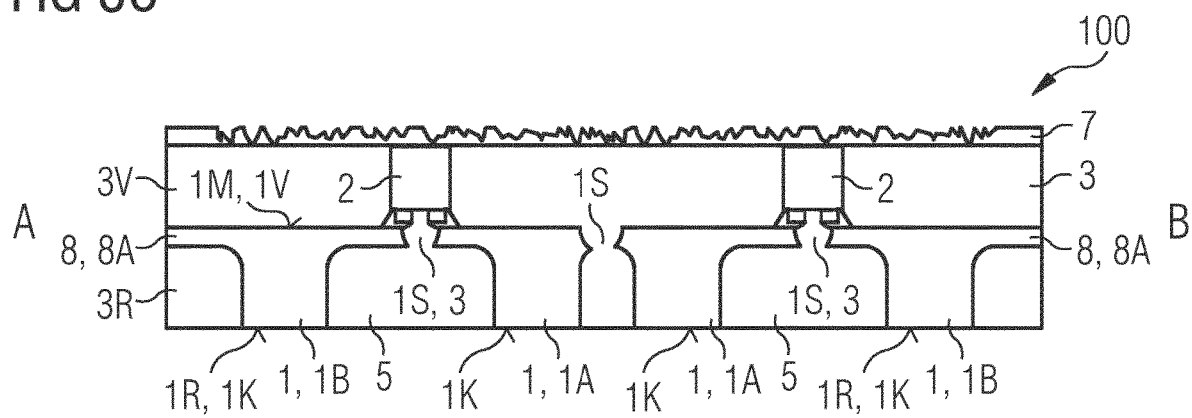

Further embodiments and developments of the component or of the method for producing the component will become apparent from the exemplary embodiments explained below in conjunction with FIGS. 1A to 8C, in which:

FIGS. 1A, 1B and 1C show schematic illustrations of one exemplary embodiment of a component in plan view and in sectional views, FIGS. 1D, 1E, 1F, 1G, 1H, 1I and 1J show schematic illustrations of further exemplary embodiments of a component in sectional views, FIGS. 2A and 2B show schematic illustrations of further exemplary embodiments of a component in each case in plan view, FIGS. 3A, 3B and 3C show schematic illustrations of some comparative examples of a component and a comparative example of a component on a printed circuit board with electrical conductor tracks in each case in plan view, FIG. 4 shows a schematic illustration of one exemplary embodiment of a component with electrical conductor tracks in plan view, FIGS. 5A and 5B show schematic illustrations of some method steps in accordance with one exemplary embodiment for producing a component, FIGS. 6A, 6B, 6C, 6D, 6E, 6F, 7A, 7B, 7C and 7D show schematic illustrations of further method steps in accordance with various exemplary embodiments for producing a component, and FIGS. 8A, 8B and 8C show schematic illustrations of some method steps in accordance with a further exemplary embodiment for producing a component.

Elements that are identical, of identical type or act identically are provided with identical reference signs in the figures. The figures are in each case schematic illustrations and therefore not necessarily true to scale. Rather, comparatively small elements and in particular layer thicknesses may be illustrated with an exaggerated size for elucidation purposes.

FIGS. 1A, 1B and 1C show one exemplary embodiment of a component 100. The component 100 is illustrated schematically in a plan view of its rear side in FIG. 1A. FIG. 1B shows the component 100 along a sectional line AB identified in FIG. 1A. FIG. 1C shows an enlarged excerpt A2 from the component 100, the position of the excerpt A2 being marked in FIG. 1B.

In accordance with FIGS. 1A and 1B, the component 100 has a carrier 10 and a plurality of semiconductor chips 2 arranged thereon. The carrier 10 has a carrier layer 1, which is configured in particular for the mechanical stabilization of the carrier 10 and for the electrical contacting of the semiconductor chips 2. The carrier layer 1 forms in particular a leadframe of the component 100.

The rear side of the component 100 can be formed at least regionally by a rear side 1R of the carrier layer 1. The carrier layer 1 has a front side 1V facing away from the rear side 1R. The front side 1V serves in particular as a mounting surface 1M for receiving the semiconductor chips 2.

In accordance with FIG. 1B, the carrier 10 can be formed exclusively or principally from a carrier layer 1. For example, at least 50%, 60%, 70%, 80%, 90% or at least 95% by weight or volume of the carrier 10 can be allotted to the carrier layer 1. The carrier layer 1 has a vertical layer thickness D that is for example between 5 µm and 500 µm inclusive, for instance between 10 µm and 200 µm inclusive. In a departure therefrom, it is possible for the carrier 10 to have further constituent parts in addition to the carrier layer 1, for instance a connection layer, an encapsulation layer, contact structures, metallic coatings and/or further connecting layers.

The carrier layer 1 can be embodied as a single electrically conductive stabilization layer of the carrier 10. In particular, the carrier 10 has no further electrically conductive layer that does not directly adjoin the carrier layer 1 and significantly contributes to the mechanical stabilization of the carrier 10.

In a departure from FIG. 1B, however, it is possible for the carrier 10 to have at least one front-side and/or rear-side electrically conductive coating for instance indirectly or directly on the carrier layer 1 and/or further in particular electrically insulating layers in order to increase the mechanical stability of the carrier 10.

As illustrated schematically in FIGS. 1A and 1B, the carrier layer 1 has a plurality of partial layers 1A and 1B spaced apart laterally. The partial layers 1A and 1B can be formed from the same material, for example from copper, silver, aluminum or nickel. The partial layer 1A and the further partial layer 1B can be assigned to different electrical polarities of the component 100. For example, the partial layers 1A illustrated in FIGS. 1A and 1B are assigned to a first electrical polarity of the component 100. The partial layers 1B can be assigned to a second electrical polarity of the component 100, said second electrical polarity being different than the first electrical polarity. The partial layers 1A and 1B can be electrically contacted externally via contact points 1K or connection pads 1K for instance on a rear side 1R of the carrier layer 1.

The contact points 1K or the connection pads 1K can be formed by exposed surfaces of the partial layers 1A and 1B. Alternatively, it is possible for the contact points 1K or the connection pads 1K to be formed by surfaces of contact structures, wherein the contact structures can be arranged indirectly or directly on the rear side 1R of the carrier layer 1. As illustrated schematically in FIG. 1A, the partial layers 1B and 1A can be electrically contactable in each case at exactly one contact point 1K or at a plurality of contact points 1K.

In accordance with FIGS. 1A and 1B the partial layers 1A and 1B of the carrier layer 1 are spaced apart spatially from one another in lateral directions. The partial layers 1A and 1B can be electrically insulated from one another. An intermediate region 1S is in each case formed between the adjacent partial layers 1A and 1B, said intermediate region being embodied in particular in the form of a gap and ensuring that the adjacent partial layers 1A and 1B are spatially separated and electrically isolated from one another by the respective intermediate region 1S. The intermediate regions 1S can form a network composed of channels that partly or completely enclose the respective partial layers 1A and 1B in lateral directions. The intermediate region 1S or the plurality of intermediate regions 1S can be partly or completely filled by a material of an encapsulation layer 3. The partial layers 1A and 1B are held together in particular by the encapsulation layer 3.

FIGS. 1A and 1B illustrate that the adjacent partial layers 1A and 1B assigned in particular to different electrical polarities of the component 100 are separated by an intermediate region 1S, wherein the intermediate region 1S is filled regionally by an insulation layer 4. In particular, the insulation layer 4 and the encapsulation layer 3 differ from one another in their material composition. For example, the insulation layer 4 is formed from a material that is more resistant to etching than a material of the encapsulation layer 3. The insulation layer 4 can be embodied as an etch stop layer or as a solder resist layer. The insulation layer 4 can be a nitride layer or an oxide layer. Moreover, it is possible for the insulation layer 4 to be an organic layer or a silicone-containing layer. The encapsulation layer 3 can be formed from a potting material such as epoxy, silicone or synthetic resin. In accordance with FIG. 1B, only the intermediate regions 1S between adjacent partial layers 1A and 1B of different electrical polarities are filled by the insulation layer 4. The intermediate regions 1S between adjacent partial layers 1A or 1B of identical electrical polarities can be free of the insulation layer 4. Such intermediate regions 1S can be filled exclusively by the material of the encapsulation layer 3.

The component 100 has a plurality of semiconductor chips 2 arranged on the carrier layer 1 and electrically conductively connected thereto. In particular, the semiconductor chips 2 are arranged in groups 2G on the carrier layer 1. Each of the groups 2G can form a pixel of a display device. The pixel is configured in particular for representing an arbitrary color point. For example, the group 2G that forms a pixel has exactly three or exactly four optoelectronic semiconductor chips 2 configured for generating electromagnetic radiations of different peak wavelengths during operation of the component 100. In particular, the semiconductor chips 2 of the same group 2G are individually drivable, such that an arbitrary color can be represented by superimposition of the electromagnetic radiations generated by the semiconductor chips 2.

FIG. 1A schematically illustrates that each group 2G has exactly three semiconductor chips 2, for instance one semiconductor chip 2 which emits red light, one which emits green light and one which emits blue light. FIG. 1A illustrates a component 100 composed of four such groups 2G. However, the component 100 can have an arbitrary number of such groups 2G. For example, the number of groups 2G is between 3 and 3000, 5 and 2000, 10 and 1000 or between 10 and 100 inclusive.

In accordance with FIG. 1A, all the semiconductor chips 2 of the same group 2G have a common electrode formed by a partial layer 1A of the carrier layer 1. For example, the common electrode is an anode or a cathode. The semiconductor chips 2 of the same group 2G additionally have in each case a further electrode formed by one of the partial layers 1B. The semiconductor chips 2 can be driven individually via the further electrodes or via the partial layers 1B. All the partial layers 1A can be assigned to a first electrical polarity of the component 100. All the partial layers 1B can be assigned to a second electrical polarity of the component 100. In particular, all the partial layers 1A and 1B are situated on the same vertical plane. The electrical isolation between the partial layers 1A and 1B is effected in particular by the spatial separation between the partial layers 1A and 1B and by the encapsulation layer 3 and/or the insulation layer 4.

In accordance with FIGS. 1A and 1B, the semiconductor chips 2 can be arranged in such a way that they laterally bridge in each case two partial layers 1A and 1B of different electrical polarities in a plan view of the carrier layer 1. Two partial layers 1A and 1B of different electrical polarities can thus be assigned to each semiconductor chip 2, wherein in plan view the semiconductor chip 2 regionally covers the two partial layers 1A and 1B associated with it and laterally bridges the intermediate region 1S arranged between the two partial layers 1A and 1B.

The semiconductor chip 2 can be mechanically and electrically connected to the two partial layers 1A and 1B associated with it via connecting layers 2S. FIG. 1C schematically illustrates that such a semiconductor chip 2 has two rear-side contacts 2K, which are electrically and mechanically connected to the partial layers 1A and 1B via the connecting layers 2S. In order to reduce a risk of short circuit, the intermediate region 1S covered by the associated semiconductor chip 2 in plan view can be filled regionally by the encapsulation layer 3 and regionally by the insulation layer 4.

In accordance with FIG. 1B, the encapsulation layer 3 is arranged only on the front side 1V or on the mounting surface 1M. Along the vertical direction, the encapsulation layer 3 and the semiconductor chips 2 can terminate flush with one another. In a lateral direction, the semiconductor chips 2 can be enclosed, in particular fully circumferentially enclosed, by the encapsulation layer 3. The encapsulation layer 3 can be embodied such that it is radiation-nontransmissive. The semiconductor chips 2 can thus be surrounded laterally by a so-called black framing material, and what is achieved as a result is, on account of the high contrast, an emission behavior that is as homogeneous as possible, in particular a so-called Lambertian emission behavior, for all semiconductor chips 2 of the same group and thus a small color change over the viewing angle. In particular, a front side of the semiconductor chip 2 facing away from the mounting surface 1M is free of a covering by the encapsulation layer 3 in plan view.

In accordance with FIG. 1B, the component 100 has an output coupling layer 7, which covers, in particular completely covers, the semiconductor chips 2 in plan view. For example, the output coupling layer 7 is embodied in structured fashion and has local depressions and local elevations. The output coupling layer 7 is embodied such that it is radiation-transmissive, in particular. For example, the output coupling layer 7 is formed from a material that has a higher refractive index than ambient air and a lower refractive index than a semiconductor body of the semiconductor chip 2. The presence of the output coupling layer 7 enables total internal reflections to be suppressed, as a result of which the output coupling efficiency of the component 100 can be increased. The light mixing effects are also improved by the presence of the output coupling layer 7.

In accordance with FIGS. 1A and 1B, the front sides 1V of the partial layers 1A and 1B are embodied in planar fashion. Apart from the interspaces 1S, the front sides 1V form the mounting surface 1M embodied in particular in planar fashion. The carrier layer 1 has in particular no regions that project beyond the mounting surface 1M in the direction of the semiconductor chips 2. The mounting surface 1M is in particular the frontmost surface of the carrier layer 1. If the semiconductor chip 2 is mounted on the mounting surface 1M, the semiconductor chip 2 is situated in particular completely above the carrier layer 1 and thus projects beyond the carrier layer 1 along the vertical direction. For example, the carrier layer 1 has no regions that enclose the semiconductor chips 2 or the rear-side contacts 2K of the semiconductor chips in lateral directions. The mounting surface 1M is not formed by a bottom surface of a cavity of the carrier layer 1.

Unlike the front sides 1V, the rear sides 1R of the partial layers 1A or 1B are embodied in structured fashion and have in particular local depressions or elevations. The depressions of the partial layers 1A or 1B can form cavity-like openings 5 of the carrier layer 1. In particular, the cavity-like openings 5 on the rear side of the carrier layer 1 are respectively assigned to one of the interspaces 1S on the front side of the carrier layer 1. Between the rear side 1R and the interspace 1S, the associated partial layer 1A or 1B can have a monotonically increasing cross section along the vertical direction toward the mounting surface 1M. The interspace 1S can also have a monotonically increasing cross section along the vertical direction toward the mounting surface 1M. The cavity-like opening 5 has in particular a larger cross section than the associated interspace 1S.

The cavity-like opening 5 and/or the interspace 1S have/has side walls formed by surfaces of different partial layers 1A and/or 1B. The side walls of the opening 5 or of the interspace 1S are therefore not embodied in continuous fashion. Rather, the side walls of the opening 5 or of the interspace 1S are formed from separate side surfaces of the at least two, three or four adjacent partial layers 1A or 1B. The side walls of the opening 5 or the interspace 1S are embodied in particular in curved fashion. For example, the cavity-like openings 5 and/or the interspaces 1S are formed by etching processes, in particular by different processes.

The cavity-like opening 5 and the associated interspace 1S can be connected to one another. As illustrated schematically in FIG. 1B, the insulation layer 4 or the encapsulation layer 3 can extend from the interspace 1S slightly into the associated cavity-like opening 5. Apart from this exception, the cavity-like opening(s) 5 can be substantially free of a covering by the insulation layer 4 or the encapsulation layer 3. In particular, the side walls of the cavity-like opening(s) 5 are free or substantially free of a covering by the material of the insulation layer 4 and/or of the encapsulation layer 3.

The exemplary embodiment illustrated in FIG. 1D substantially corresponds to the exemplary embodiment of a component 100 as illustrated in FIG. 1B. In contrast thereto, the cavity-like openings 5 are filled, in particular completely filled, by the material of the encapsulation layer 3. The rear side 1R of the carrier layer 1 has regions that are not covered by the encapsulation layer 3. These regions form the contact points 1K of the partial layers 1A and 1B.

In accordance with FIG. 1D, the encapsulation layer 3 is thus situated both above and below the mounting surface 1M. Such a design of the encapsulation layer 3 embodied in particular in continuous fashion enables the laterally spaced apart partial layers 1A and 1B to be connected to one another particularly stably. In particular apart from the marginal partial layers 1A and 1B, the inner partial layers 1A and 1B can be fully circumferentially enclosed by the encapsulation layer 3. The marginal partial layers 1A and 1B can have regions that are not enclosed by the encapsulation layer 3 at the side surfaces of the component 100. Along the lateral direction, the marginal partial layers 1A and 1B can terminate flush with the encapsulation layer 3. The marginal partial layers 1A and 1B can have singulation traces at the side surfaces of the component 100. In particular, parts of the marginal partial layers 1A and 1B can serve as holding elements or as a holding frame during the production of the component 100.

The component 100 in accordance with FIG. 1D can be free of the insulation layer 4. In contrast to FIG. 1B, the interspaces 1S can be filled, in particular completely filled, by the encapsulation layer 3, for instance exclusively by the encapsulation layer 3. In a departure therefrom, it is possible for the component 100 in accordance with FIG. 1D likewise to have an insulation layer 4 of the kind for example as illustrated in 1B.

The exemplary embodiment illustrated in FIG. 1E substantially corresponds to the exemplary embodiment of a component 100 as illustrated in FIG. 1B. In contrast thereto, both the front side 1V and the rear side 1R of the carrier layer 1 are embodied in planar fashion. Moreover, the component 100 can be free of an insulation layer 4 illustrated for instance in FIG. 1B. In accordance with FIG. 1E, the carrier layer 1 is provided with a connection layer 90 on its rear side 1R. The connection layer 90 is embodied in structured fashion and can have a plurality of partial layers corresponding to the partial layers 1A and 1B of the carrier layer 1.

Contact structures 91 are formed on the partial layers of the connection layer 90, wherein the connection layer 90 is arranged between the carrier layer 1 and the contact structures 91. In this case, the contact points 1K can be formed by surfaces of the contact structures 91. The contact structures 91 can be embodied in the form of solder balls, contact columns, solder layers or in other forms. In particular, the contact structures 91 are partly or exclusively formed from a solder material. No output coupling layer 7 is illustrated in FIG. 1E. However, it is possible for the component 100 in accordance with FIG. 1C to have an output coupling layer 7 for instance in accordance with FIG. 1B.

The exemplary embodiment illustrated in FIG. 1F substantially corresponds to the exemplary embodiment of a component 100 as illustrated in FIG. 1E. In contrast thereto, the contact structures 91 each have a spherical core 92 enclosed by a connecting material, in particular by a solder material. The connecting material is thus part of the contact structure 91, wherein the connecting material can directly adjoin the carrier layer 1 and the core 92. The core 92 can be formed from a metal, for instance from copper.

The exemplary embodiment illustrated in FIG. 1G substantially corresponds to the exemplary embodiment of a component 100 as illustrated in FIG. 1F. In contrast thereto, the encapsulation layer 3 has a front-side partial layer 3V and a rear-side partial layer 3R.

The front-side partial layer 3V substantially corresponds to the encapsulation layer 3 described in FIG. 1B, for example. The rear-side partial layer 3R is arranged in particular below the mounting surface 1M and can regionally fully circumferentially enclose the contact structures 91. It is possible for the front-side partial layer 3V and the rear-side partial layer 3R to be formed from the same material or from different materials. As illustrated schematically in FIG. 1G, the contact structures 91 can project regionally from the rear-side partial layer 3R of the encapsulation layer 3. Those regions of the contact structures 91 which are not covered by the rear-side partial layer 3R can form the contact points 1K of the carrier layer 1.

The exemplary embodiment illustrated in FIG. 1H substantially corresponds to the exemplary embodiment of a component 100 as illustrated in FIG. 1F. In contrast thereto, the semiconductor chips 2 are completely covered by the encapsulation layer 3, in particular by the front-side partial layer 3V of the encapsulation layer 3, in plan view. The front-side partial layer 3V is embodied such that it is radiation-transmissive, in particular.

The exemplary embodiment illustrated in FIG. 1I substantially corresponds to the exemplary embodiment of a component 100 as illustrated in FIG. 1H. In contrast to the component 100 in accordance with FIG. 1H, which is free of a rear-side partial layer 3R of the encapsulation layer 3, the component 100 in accordance with FIG. 1I has a rear-side partial layer 3R of the encapsulation layer 3. In particular, the front-side partial layer 3V and the rear-side partial layer 3R differ in their material composition. For example, the rear-side partial layer 3R can be formed from a radiation-nontransmissive material.

The exemplary embodiment illustrated in FIG. 1J substantially corresponds to the exemplary embodiment of a component 100 as illustrated in FIG. 1H. In contrast thereto, the interspaces 1S are in particular free of a covering by the semiconductor chips 2. In particular, the semiconductor chips 2 are in each case arranged completely on a partial layer 1A or 1B of the carrier layer 1. As a further difference with respect to FIG. 1H, the semiconductor chips 2 do not have rear-side contacts 2K, but rather front-side contacts 2K, which are electrically conductively connected to the corresponding partial layers 1A or 1B of the carrier layer 1 for example via bond wires 2W. In a departure from FIG. 1J, it is possible for the semiconductor chips 2 each to have a front-side contact 2K and a rear-side contact 2K, the semiconductor chips 2 each being electrically conductively connected to one of the partial layers 1A or 1B via the rear-side contact 2K and to a further one of the partial layers 1A or 1B via the front-side contact 2K and for instance via a bond wire 2W.

FIG. 2A schematically illustrates a further exemplary embodiment of a component 100. The exemplary embodiment illustrated in FIG. 2A substantially corresponds to the exemplary embodiment illustrated in FIG. 1A. In contrast thereto, not only semiconductor chips 2 of the same group 2G but also semiconductor chips 2 of adjacent groups 2G can have one common electrode or a plurality of common electrodes.

In contrast to FIG. 1A, in which three, in particular exactly three, adjacent semiconductor chips 2 of the same group 2G share one common electrode, in accordance with FIG. 2A two, in particular exactly two, adjacent semiconductor chips 2 of the same group 2G can share one common electrode formed by a partial layer 1A of the carrier layer 1. While the semiconductor chips 2 of different groups 2G in accordance with FIG. 1A do not have a common electrode, these semiconductor chips in accordance with FIG. 2A can share a common electrode. The common electrode can be formed by two partial layers 1B that are spaced apart from one another spatially and are electrically conductively connected to one another by a conductor track 11. In accordance with FIG. 2A, each group 2G forming a pixel, for example, has exactly five contact points 1K or five connection pads 1K or exactly five partial layers 1A and 1B.

In particular, the conductor track 11 is situated on the rear side of the carrier layer 1. The conductor track 11 can be arranged marginally or runs regionally between two adjacent semiconductor chips 2 of the same group 2G. FIG. 2A illustrates four marginal conductor tracks 11, which electrically conductively connect the partial layers 1B of different groups 2G to one another. Two inner conductor tracks 11 are additionally illustrated, which are led through between adjacent semiconductor chips 2 of the same group(s) in order to electrically connect the partial layers 1B of different groups 2G to one another. It is possible for the conductor track 11 to be embodied as part of the carrier layer 1. For example, the partial layers 1A and 1B and the conductor track 11 can be formed from the same material.

The exemplary embodiment illustrated in FIG. 2B substantially corresponds to the exemplary embodiment of a component 100 as illustrated in FIG. 1A. Analogously to FIG. 1A, four partial layers 1A and 1B are assigned to each group 2G. In accordance with FIG. 2B, each group 2G forming a pixel, for example, has exactly four contact points 1K or four connection pads 1K. The connection pads 1K can be made particularly large in this case. As a result, for example measuring probes can be positioned thereon more easily. In addition, an increased distance between the adjacent connection pads 1K can be realized. For example, a lateral distance between the adjacent connection pads 1K is at least 50 µm, 100 µm or at least 150 µm. That reduces the risk of a short circuit and, under certain circumstances, increases the mounting yield during application of the components 100.

The exemplary embodiment illustrated in FIG. 2B differs from the exemplary embodiment illustrated in FIG. 1A in particular additionally in the arrangement of the partial layers 1A and 1B. While in FIG. 1A the partial layers 1B not forming a common electrode are arranged on the same side of the semiconductor chips 2 of the same group 2G, the partial layers 1B in accordance with FIG. 2B are situated on different sides of the semiconductor chips 2. Analogously to FIG. 1A, all three semiconductor chips 2 of the same group 2G share a common electrode formed by a partial layer 1A of the carrier layer 1.

FIGS. 3A and 3B schematically illustrate comparative examples of different components in which the semiconductor chips 2 of the same group 2G or the semiconductor chips 2 of different groups 2G do not have a common electrode. FIG. 3A schematically illustrates a component with one pixel, and FIG. 3B a component with four pixels. The application of a plurality of such components or of one such component for representing a plurality of pixels generally requires a two-layer or multilayer construction of a printed circuit board in order to realize a cross-matrix circuit, for example. The realization of the cross-matrix circuit of one such component or of a plurality of such components for representing a plurality of pixels is illustrated schematically in FIG. 3C, for example. At least two contact planes arranged one above another are required for electrically contacting the semiconductor chips 2. FIG. 3C schematically illustrates conductor tracks E1 on a first contact plane for example for electrically contacting the anodes of the semiconductor chips 2 and conductor tracks E2 on a second contact plane for example for electrically contacting the cathodes of the semiconductor chips 2.

If the semiconductor chips 2 of the component 100 have in part common anodes and/or cathodes, it is possible for a cross-matrix circuit already to be able to be realized by electrical conductor tracks E1 in a common, in particular single, contact plane. This is illustrated schematically in FIG. 4, for example.

FIGS. 5A and 5B show some method steps for producing a component 100 in particular in accordance with any of the exemplary embodiments illustrated in FIGS. 1E, 1F, 1G, 1H, 1I and 1J.

In accordance with FIG. 5A, the carrier layer 1 can be provided on an auxiliary carrier 9. The carrier layer 1 can have a planar front side 1V and a planar rear side 1R. In particular, the carrier layer 1 has a constant layer thickness D along lateral directions. In particular, the layer thickness D is less than or equal to 100 µm, 50 µm, 40 µm or 30 µm, for instance between 10 µm and 100 µm inclusive. The carrier layer 1 can be divided into a plurality of partial layers 1A and 1B in a subsequent method step, for example by means of a mechanical process or by means of an etching method.

Alternatively, it is possible for individual separate partial layers 1A and 1B to be applied to the auxiliary carrier 9 and thus to form the structured carrier layer 1 on the auxiliary carrier 9. It is furthermore possible for the carrier layer 1 to be formed by an electrolytic method or by lamination of thin metal films on the auxiliary carrier 9. If the carrier layer 1 is subsequently structured, an etching method can be employed.

The auxiliary carrier 9 can be embodied in elastic fashion. It is possible for the auxiliary carrier 9 to be formed from a material such as polyamide, epoxy, silicone or acrylate. For example, the auxiliary carrier 9 is a flexible substrate with structured dielectric layers, wherein the dielectric layers are embodied such that they are removable, in particular. For example, the auxiliary carrier 9 is an adhesive film. It is possible for the auxiliary carrier 9 to be formed from a rigid body with an adhesive layer arranged thereon.

In subsequent method steps, the semiconductor chips 2 can be mechanically secured and electrically contacted on the mounting surface 1M of the carrier layer 1 before the encapsulation layer 3 is applied to the mounting surface 1M and around the semiconductor chips 2. The interspaces 1S situated between the partial regions 1A and 1B can be partly or completely filled with the material of the encapsulation layer 3.

In accordance with FIG. 5B, openings 9V are produced through the auxiliary carrier 9 in order to partly expose the partial layers 1A and 1B, for instance by means of etching, stamping or laser treatment. If the auxiliary carrier 9 is a flexible substrate with structured dielectric layers, the openings 9V can be formed by removing the dielectric layers. Connection layers 90 and/or contact structures 91, illustrated schematically in FIGS. 1E, 1F, 1G, 1H, 1I and 1J, for example, can be formed in the openings 9V. The contact structures 91 for example in the form of solder balls with or without a metal core, contact columns or contact pins can be printed, placed or grown onto the rear side 1R of the carrier layer 1.

In a further method step, the auxiliary carrier 9 is removed, in particular completely removed, from the component 100. Optionally, a rear-side partial layer 3R of the encapsulation layer 3 can be formed on the rear side 1R of the carrier layer 1. The component 100 is stiffened by the rear-side partial layer 3R of the encapsulation layer 3. The partial layer 3R can be formed from a molding compound. The component 100 can also be stiffened on the front side by the front-side partial layer 3V of the encapsulation layer 3. The front-side partial layer 3V can be formed by a transparent or semitransparent potting optionally comprising colorants or fillers.

FIGS. 6A, 6B, 6C, 6D, 6E and 6F show some method steps for producing a component 100 in accordance with the exemplary embodiments illustrated in FIG. 1B or 1D for instance.

Figure 6A:
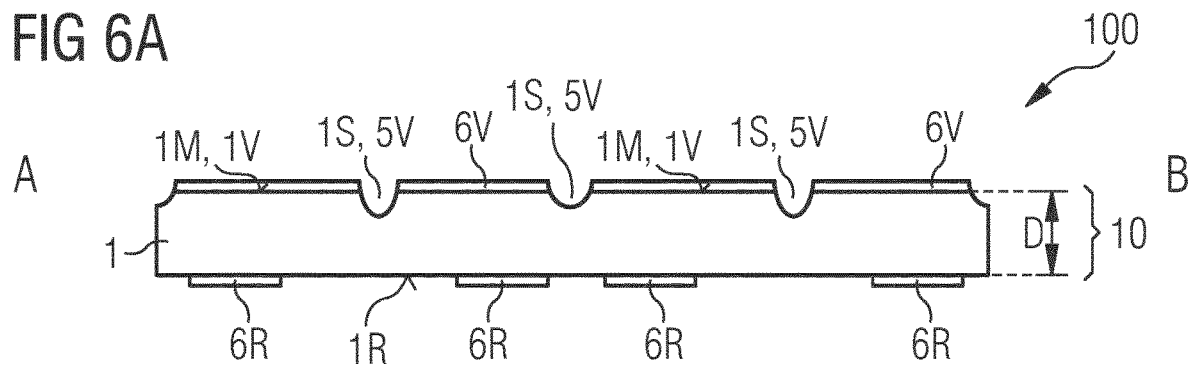

In accordance with FIG. 6A, an in particular single-layer electrical carrier layer 1 having a vertical layer thickness D is provided. A coating 6V is applied to the front side 1V of the carrier layer 1, wherein the coating 6V can form a front-side mask. A further coating 6R is applied to the rear side 1R of the carrier layer 1, wherein the coating 6R can form a rear-side mask. The coatings 6V and a 6R can be formed from an electrically conductive material, for instance from gold, nickel, gold-nickel alloy, or from an electrically insulating material, for instance from a photoresist, a nitride material or an oxide material. The coatings 6V and 6R can be removed subsequently.

With the aid of the coating 6V, a front-side trench structure 5V is formed on the front side 1V of the carrier layer 1. In this case, the front-side mask can serve as an etching mask. The front-side trench structure 5V only extends into the carrier layer 1, such that the carrier layer 1 still remains continuous. In particular, the interspaces 1S are defined by the shape of the front-side trench structure 5V.

Figure 6B:
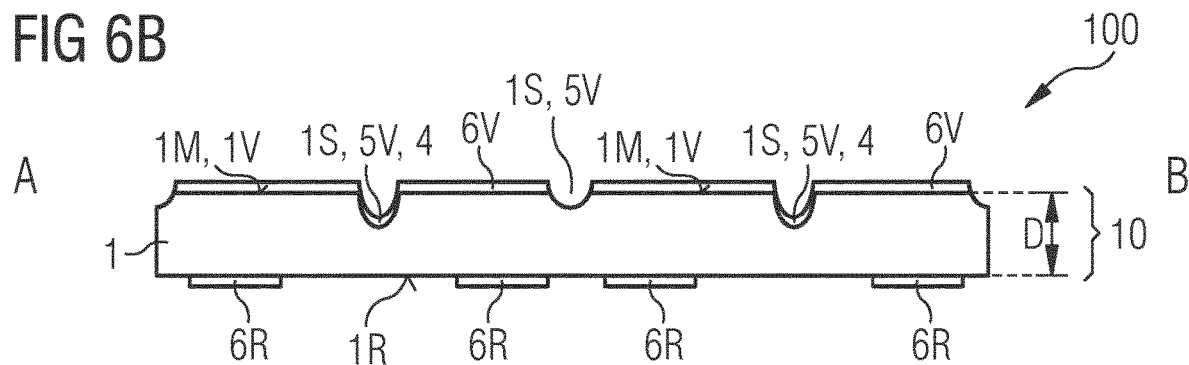

In accordance with FIG. 6B, the front-side trench structure 5V is regionally filled with a material of the insulation layer 4, in particular only in the regions provided for the semiconductor chips 2. The insulation layer 4 is formed from an insulating material, for example from epoxy. The material of the insulation layer 4 can be introduced in the front-side trench structure 5V by metering, printing or jetting. Alternatively, it is possible for the insulation layer 4 to be formed by local oxidation of the material of the carrier layer 1. For example, copper or nickel as material of the carrier layer 1 is oxidized.

Figure 6C:
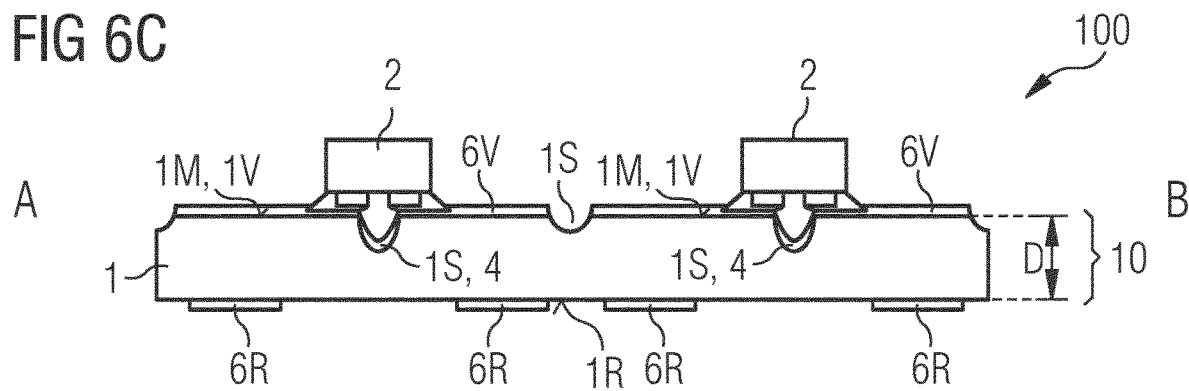

In accordance with FIG. 6C, the semiconductor chips 2 are mechanically secured and electrically contacted on the mounting surface 1M. Since the carrier layer 1 is still embodied in continuous fashion, the semiconductor chips 2 in accordance with FIG. 6C are electrically short-circuited in the meantime.

For the purpose of securing and electrically contacting the semiconductor chips 2, it is possible to carry out a soldering process with small solder balls for example having a diameter of approximately 2 μm. The solder can be applied on the entire chip mounting surface, the semiconductor chip 2 being positioned therein and the solder being remelted in a subsequent method step. In this case, the solder can wet the semiconductor chip 2 and the chip mounting surface, but not the insulated intermediate region 1S below the semiconductor chip 2. Alternatively, the use of ACF or ACP (abbreviation of: anisotropic conductive film/paste) is also possible. In particular, this does not necessitate an insulation layer 4 in the front-side trench structure 5V, since the electrical connection takes place in particular only on the plane-parallel, congruent surfaces of the semiconductor chip 2 and the carrier layer 1. Moreover, it is possible for the semiconductor chips 2 to be secured on the carrier layer 1 by way of adhesive-bonding or sintering connections by means of micrometering methods, for example.

Figure 6D:
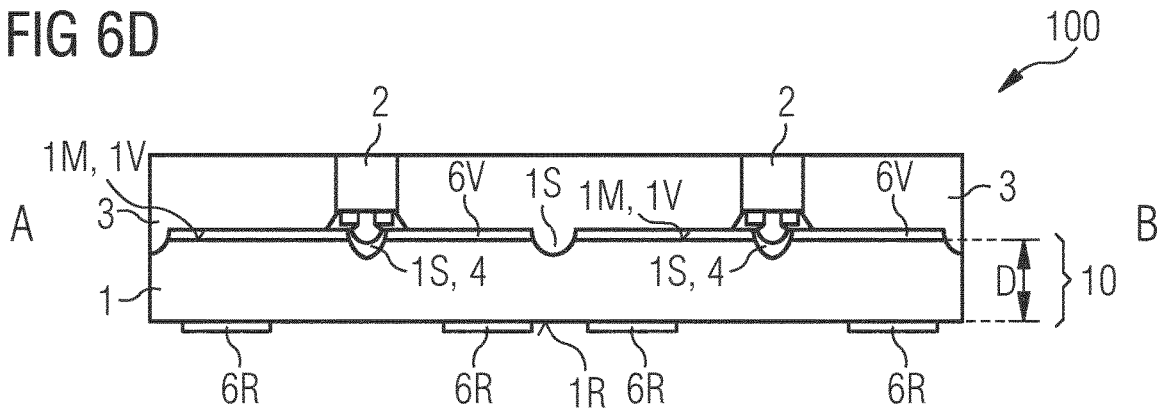
Figure 6E:
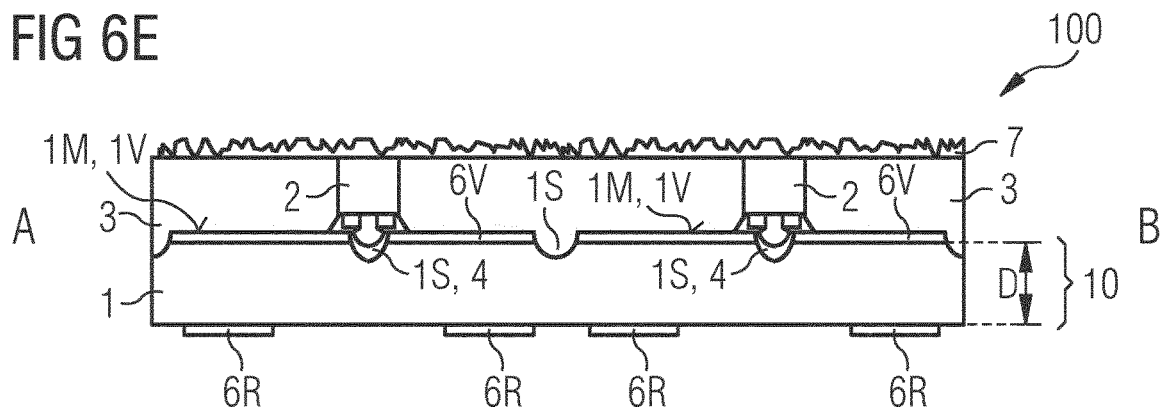

In accordance with FIG. 6D, the encapsulation layer 3 is formed on the front side 1V of the carrier layer 1, for example by means of a molding or casting method, for instance by means of a film assisted molding method. In accordance with FIG. 6E, the output coupling layer 7 is applied to the encapsulation layer 3 and to the semiconductor chips 2.

Figure 6F:
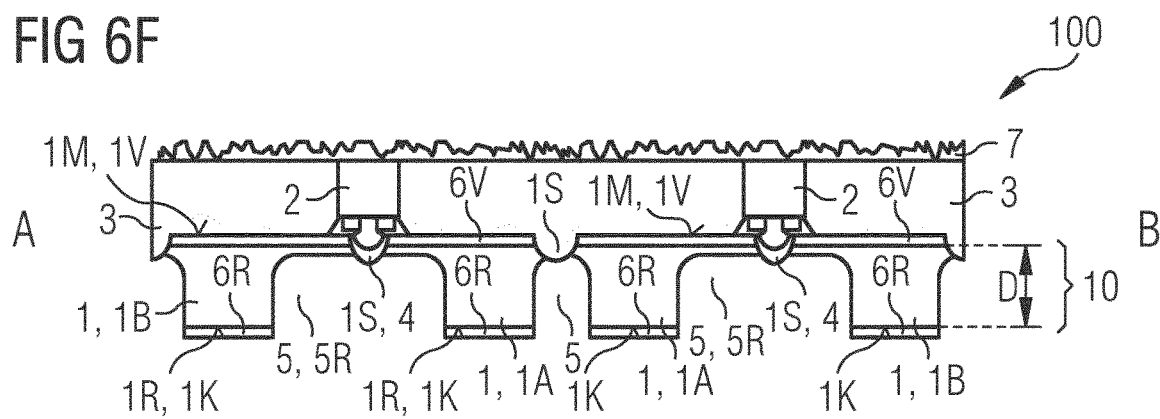

In a further method step in accordance with FIG. 6F, in particular with the aid of the rear-side coating 6R, a rear-side trench structure 5R is formed on the rear side 1R of the carrier layer 1. In this case, the mask formed by the coating 1R can serve as an etching mask.

The rear-side trench structure 5R extends from a rear side of the carrier layer 1 as far as the front-side trench structure 5V, as a result of which the carrier layer 1 is separated into a plurality of partial layers 1A and 1B spaced apart laterally.

In the rear-side trench structure 5R, the insulation layer 4 or the encapsulation layer 3 can be exposed regionally. In a departure from FIG. 6F, it is possible for a rear-side partial layer 3R of the encapsulation layer 3 to be subsequently introduced into the rear-side trench structure 5R.

In accordance with FIGS. 6A to 6F, the carrier layer 1 is structured, in particular etched, both on the front side 1V and at the rear side 1R. In particular, the semiconductor chips 2 are applied to the mounting surface 1M after the structuring of the front side 1V and before the structuring of the rear side 1R.

FIGS. 7A, 7B, 7C and 7D show some alternative method steps for producing a component 100 for instance in accordance with FIG. 1D. In particular, the carrier layer 1 structured on both sides in accordance with FIG. 7A is secured, for instance temporarily secured, on an auxiliary carrier 9. The auxiliary carrier 9 can be an auxiliary carrier 9 described in association with FIG. 5A, for instance. The structured carrier layer 1 on the auxiliary carrier 9 already has a plurality of laterally spaced apart partial regions 1A and 1B before the semiconductor chips 2 are mechanically secured and electrically contacted on the structured carrier layer 1 in accordance with FIG. 7B.

The semiconductor chips 2 can be soldered on using a solder paste, which can contain epoxy. A relatively large amount of solder paste can be dispensed on the mounting surface 1M, whereupon the semiconductor chips 2 are inserted into the paste in each case in particular by way of the two contacts 2K. The solder melts upon heating and wets the contacts 2K and simultaneously dewets the regions between the contacts 2K, with the result that no short circuit arises. The epoxy contained in the solder paste cures and fills the regions between the contacts 2K in order to increase the mechanical stability of the semiconductor chips 2 on the carrier layer 1.

In accordance with FIG. 7C, the encapsulation layer 3 is applied to the mounting surface 1M and to the auxiliary carrier 9. The encapsulation layer 3 has a front-side partial layer 3V and a rear-side partial layer 3R. In particular, the partial layers 3V and 3R are formed from the same material and can be formed in a common process. The encapsulation layer 3 is applied in particular by means of a so-called casting process.

In accordance with FIG. 7D, the auxiliary carrier 9 is removed, in particular before or after the output coupling layer 7 is formed on the encapsulation layer 3.

FIGS. 8A, 8B and 8C show further method steps for producing a component 100 for example in accordance with FIGS. 1A and 1D in particular with the aid of a holding structure 8. The holding structure 8 has a plurality of holding elements 8A and a holding frame 8B for instance in the form of holding strips 8B. The holding structure 8 and the carrier layer 1 can be formed from the same material or from different materials.

In accordance with FIG. 8A, the partial layers 1A and 1B are mechanically connected to the holding frame 8B via the holding elements 8A also after the semiconductor chips 2 have been secured on the mounting surface 1M. The holding frame 8B encloses the partial layers 1A and 1B of the carrier layer 1 of a component 100 in lateral directions, the holding elements 8A mechanically connecting the partial layers 1A and 1B to the holding frame 8B. The holding structure 8 can simplify the process of forming the front-side trench structure 5V and the rear-side trench structure 5R. The encapsulation layer 3, too, can be applied to both sides of the carrier layer 1 in a simple manner. For example, firstly a first partial layer 3V is applied to the front side 1V of the carrier layer 1, wherein after rotation of the component 100, for instance, a second partial layer 3R can be applied to the rear side 1R of the carrier layer 1 without relatively great complexity or outlay.

FIG. 8B illustrates a plurality of such components 100, each of which is connected to the corresponding holding frame 8B or to the holding strips 8B via the holding elements 8A. Each component 100 can be surrounded by a holding frame 8B. For the purpose of singulating the components 100, the holding elements 8A can be severed, for instance sawn through, along the separating lines T. The partial layers 1A and 1B of the carrier layer 1 are electrically isolated from one another in particular only after singulation.

FIG. 8C shows a component 100 after singulation. The component 100 may have singulation traces, for instance sawing traces, on the holding elements 8A, which are detectable for example on the side surfaces of the component 100.

As illustrated schematically in FIGS. 8A and 8B, some or all of the partial layers 1A and 1B of the carrier layer 1 can be freely accessible regionally at the side surfaces of the component 100. In this case, some or all of the anodes or all of the cathodes of laterally adjacent pixels can be electrically connected to one another in particular after singulation as well. That is even desirable with regard to the electrical functionality of a cross-matrix circuit and additionally increases the stability of the carrier layer 1 or of the component 100.

The invention is not restricted to the exemplary embodiments by the description of the invention on the basis of said exemplary embodiments. Rather, the invention encompasses any novel feature and also any combination of features, which in particular includes any combination of features in the claims, even if this feature or this combination itself is not explicitly specified in the claims or exemplary embodiments.

LIST OF REFERENCE SIGNS

100 Component
10 Carrier
1 Carrier layer
1A Partial layer of the carrier layer
1B Partial layer of the carrier layer
1K Contact point, connection pad
1M Mounting surface
1V Front side of the carrier layer
1R Rear side of the carrier layer
1S Intermediate region
11 Conductor track
2 Semiconductor chip
2G Chip group
2K Contact of the semiconductor chip
2W Bond wire
2S Connecting layer
3 Encapsulation layer
3V Front-side partial layer of the encapsulation layer
3R Rear-side partial layer of the encapsulation layer
4 Insulation layer
5 Cavity-like opening of the carrier layer
5V Front-side trench structure
5R Rear-side trench structure
6V Coating/front-side mask
6R Coating/rear-side mask
7 Output coupling layer
8 Holding structure
8A Holding element
8B Holding strip, holding frame
9 Auxiliary carrier/adhesive film
9V Opening of the auxiliary carrier/adhesive film
90 Connection layer
91 Contact structure, solder ball, contact column, solder layer
92 Core of the solder ball
A2 Excerpt
D Vertical layer thickness of the carrier layer
E1 Conductor track of first contact plane
E2 Conductor track of second contact plane
T Separating line

The invention claimed is:

1. A component comprising a carrier and a plurality of semiconductor chips, wherein
the carrier has an electrically conductive carrier layer, wherein the carrier layer is embodied in structured fashion and has a plurality of partial layers spaced apart laterally,
the carrier has an encapsulation layer laterally enclosing the semiconductor chips, wherein the encapsulation layer is embodied in continuous fashion and thus holds together the laterally spaced apart partial layers of the carrier layer,
the encapsulation layer and the semiconductor chips, along the vertical direction perpendicular to a main surface of extent of the carrier or the carrier layer, terminate flush with one another,
the carrier layer has a mounting surface, on which the semiconductor chips are arranged, wherein the semiconductor chips are mechanically supported by the carrier layer and are electrically conductively connected to the partial layers,
the carrier has a common electrode for semiconductor chips of a group composed of a plurality of the semiconductor chips, wherein the common electrode is formed by one of the partial layers or by a plurality of partial layers—which are in electrical contact with one another—of the carrier layer, the two adjacent partial layers of the carrier layer are spaced apart laterally from one another by an intermediate region, wherein the two adjacent partial layers are assigned to different electrical polarities of the component, the intermediate region has a lateral width that is at most 50 µm, and one of the semiconductor chips is electrically conductively connected to the two adjacent partial layers, in plan view partly covers the two adjacent partial layers and bridges the associated intermediate region situated between the two adjacent partial layers.

2. The component as claimed in claim 1, wherein the carrier layer has a vertical layer thickness of between 20 µm and 200 µm inclusive.

3. The component as claimed in claim 1, wherein the semiconductor chips are configured for generating electromagnetic radiation, wherein the group composed of those semiconductor chips which share the common electrode forms one pixel or a plurality of pixels.

4. The component as claimed in claim 3, wherein those semiconductor chips which share the common electrode and form one pixel are in each case electrically conductively connected to a further individual partial layer and thus individually drivable via the partial layers.

5. The component as claimed in claim 1, wherein the intermediate region is filled with an insulation layer, which electrically insulates two adjacent partial layers of the carrier layer from one another.

6. The component as claimed in claim 1, wherein the mounting surface has a plurality of laterally spaced apart partial mounting surfaces formed by surfaces of the partial layers.

7. The component as claimed in claim 1, wherein the mounting surface is coated with a noble metal, wherein the carrier layer has a rear side facing away from the mounting surface, said rear side being at least partly coated with the same noble metal.

8. The component as claimed in claim 1, wherein the mounting surface is embodied in planar fashion, wherein
the semiconductor chips project beyond the entire carrier layer along the vertical direction, and
the carrier layer has no partial region that projects beyond the planar mounting surface in the direction of the semiconductor chips.

9. The component as claimed in claim 1, wherein the partial layers have rear side surfaces facing away from the mounting surface, wherein
the rear side surfaces are embodied in curved fashion regionally,
cavity-like openings of the carrier layer are formed by the curved rear side surfaces of adjacent partial layers, and
the openings are filled with the encapsulation layer in order to increase the mechanical stability of the carrier.

10. The component as claimed in claim 1, wherein the partial layers have planar rear side surfaces facing away from the mounting surface, wherein
the rear side surfaces are free of a covering by the encapsulation layer, and
the carrier has at least one solder ball or a contact structure on the respective rear side surfaces of the partial layers of the carrier layer.

11. The component as claimed in claim 1, wherein the partial layers have rear side surfaces facing away from the mounting surface, wherein
the semiconductor chips are laterally enclosed by a front-side partial layer of the encapsulation layer, and
contact structures laterally enclosed by a rear-side partial layer of the encapsulation layer are formed on the rear side surfaces, and
the front-side partial layer and the rear-side partial layer of the encapsulation layer differ from one another in their material composition.

* * * * *